(12) United States Patent
Nishida et al.

(10) Patent No.: US 9,379,150 B2
(45) Date of Patent: Jun. 28, 2016

(54) SOLID-STATE IMAGE SENSING DEVICE AND METHOD FOR MANUFACTURING THE SAME

(71) Applicant: Renesas Electronics Corporation, Kawasaki-shi, Kanagawa (JP)

(72) Inventors: Yukio Nishida, Kanagawa (JP); Tomohiro Yamashita, Kanagawa (JP); Yuki Yamamoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/523,865

(22) Filed: Oct. 25, 2014

(65) Prior Publication Data

US 2015/0123178 A1 May 7, 2015

(30) Foreign Application Priority Data

Nov. 7, 2013 (JP) .................................. 2013-231535

(51) Int. Cl.
*H01L 27/146* (2006.01)
*H01L 27/148* (2006.01)
*H01L 31/14* (2006.01)

(52) U.S. Cl.
CPC .... *H01L 27/14612* (2013.01); *H01L 27/14614* (2013.01); *H01L 27/14643* (2013.01); *H01L 27/14689* (2013.01)

(58) Field of Classification Search
CPC ................ H01L 27/14643; H01L 27/14612; H04N 3/155; H04N 3/14; H04N 5/335
USPC ............................................ 438/73; 257/292
See application file for complete search history.

(56) References Cited

U.S. PATENT DOCUMENTS

| 7,611,940 B2* | 11/2009 | Lee ................................ 438/200 |
| 2005/0062084 A1* | 3/2005 | Han ............................... 257/292 |
| 2005/0136579 A1* | 6/2005 | Hao et al. ...................... 438/197 |
| 2006/0006391 A1* | 1/2006 | Matsumura ......... H01L 27/1285 257/72 |
| 2007/0037313 A1* | 2/2007 | Lee .................. H01L 27/14689 438/57 |
| 2009/0289282 A1* | 11/2009 | Tsuno ........................... 257/219 |

(Continued)

FOREIGN PATENT DOCUMENTS

| JP | 05-3311 A | 1/1993 |
| JP | 2008-218836 A | 9/2008 |

OTHER PUBLICATIONS

Wagner, P.J., et al., "On the Correlation Between NBTI, SILC, and Flicker Noise" Christian Doppler Laboratory for TCAD in Microelectronics at the Institute for Microelectronics, IEEE 2012, pp. 60-64.

(Continued)

*Primary Examiner* — Moazzam Hossain
(74) *Attorney, Agent, or Firm* — Shapiro, Gabor and Rosenberger, PLLC

(57) ABSTRACT

The present invention improves the performance of an image sensor. In a planar view, fluorine is introduced into a part overlapping with a channel region in a gate electrode GE1 of an amplification transistor and is not introduced into the interior of a semiconductor substrate 1S. Concretely as shown in FIG. 20, a resist film FR1 is patterned in the manner of opening the part planarly overlapping with the channel region in the gate electrode GE1. Then fluorine is injected into the interior of the gate electrode GE1 exposed from an opening OP1 by an ion implantation method using the resist film FR1 in which the opening OP1 is formed as a mask.

8 Claims, 26 Drawing Sheets

(56) References Cited

U.S. PATENT DOCUMENTS

| | | | |
|---|---|---|---|
| 2009/0295973 A1* | 12/2009 | Oshikubo et al. | 348/311 |
| 2010/0025569 A1* | 2/2010 | Matsumoto et al. | 250/208.1 |
| 2010/0117126 A1* | 5/2010 | Takahashi | 257/292 |
| 2012/0319210 A1* | 12/2012 | Tsao | H01L 21/823814 257/392 |
| 2013/0049129 A1 | 2/2013 | Feng et al. | |
| 2013/0113024 A1* | 5/2013 | Shinohara | 257/225 |
| 2014/0361385 A1* | 12/2014 | Zaka et al. | 257/412 |

OTHER PUBLICATIONS

Extended European Search Report issued Apr. 2, 2015, in European Patent Application No. 14188687.9.

* cited by examiner

FIG. 4

| G | B | G |
|---|---|---|
| R | G | R |
| G | B | G |

| Y | C | Y |
|---|---|---|
| G | M | G |
| Y | C | Y |

CF

SOLID-STATE IMAGE SENSING DEVICE AND METHOD FOR MANUFACTURING THE SAME

CROSS-REFERENCE TO RELATED APPLICATIONS

The disclosure of Japanese Patent Application No. 2013-231535 filed on Nov. 7, 2013 including the specification, drawings and abstract is incorporated herein by reference in its entirety.

BACKGROUND

The present invention relates to: a solid-state image sensing device typified, for example, by a CMOS (Complementary Metal Oxide Semiconductor) image sensor; and a method for manufacturing the device.

In Japanese Published Unexamined Application No. 2008-218836 (Patent Literature 1), a technology of configuring a gate electrode by a nickel fullsilicide electrode is described. Specifically in Patent Literature 1, it is described that fluorine having a silicidation reaction inhibitory effect is injected into a gate electrode in order to form a nickel fullsilicide electrode having a composition of a nickel monosilicide.

CITATION LIST

Patent Literature

Patent Literature 1
Japanese Published Unexamined Application No. 2008-218836

SUMMARY

In a solid-state image sensing device typified by a CMOS image sensor for example, to reduce a baseline noise perceived as a phenomenon of an image not being coal-black even when it is dark is a large challenge. It is known that the baseline noise is strongly correlated with a 1/f noise (flicker noise) generated at an n-channel field-effect transistor called an "amplification transistor" included in a pixel. It is therefore important to reduce a 1/f noise generated at an "amplification transistor" in order to reduce a baseline noise.

In this context, it is known that it is effective to reduce a dangling bond (unsaturated bond) existing in a gate insulation film of an "amplification transistor" in order to reduce a 1/f noise and, as a method for reducing the dangling bond, there is a method of combining fluorine with the dangling bond. For example, it is conceivable to introduce fluorine into a solid-state image sensing device including the "amplification transistor" by an ion implantation method.

A bad influence by a pollutant (contaminant) contained in an ion beam including fluorine is however concerned. That is, if a metal atom typified for example by tungsten (W) intrudes into a semiconductor substrate as a pollutant, the number of white spots at dark and the dark current of a solid-state image sensing device may increase undesirably. This is presumably caused by the fact that a metal atom having intruded into a semiconductor substrate diffuses and resultantly reaches a photodiode functioning as a photoelectric conversion section and thus a defect level is generated. That is, it is estimated that, when a defect level is generated, in a photodiode, a leak current increases through the defect level and the increase of the leak current leads to the increase of the number of white spots at dark and the dark current.

In this way, whereas to introduce fluorine into a solid-state image sensing device is effective from the viewpoint of reducing the 1/f noise of an "amplification transistor" and reducing the baseline noise of the solid-state image sensing device, it is concerned that the number of white spots at dark and the dark current may be caused to increase by a pollutant introduced together when fluorine is introduced. That is, from the viewpoint of reducing the baseline noise of a solid-state image sensing device and inhibiting the number of white spots at dark and the dark current from increasing, a method of merely introducing fluorine into the solid-state image sensing device is insufficient and there is still room for improvement.

Other problems and novel features will be obvious from the descriptions in the present specification and the attached drawings.

In a solid-state image sensing device according to an embodiment, fluorine is introduced into a part overlapping with a channel region in a gate electrode of an amplification transistor in plan view.

Further, a method for manufacturing a solid-state image sensing device according to an embodiment includes the steps of forming a gate electrode of an amplification transistor and successively introducing fluorine into a part overlapping with a channel region in the gate electrode in plan view.

According to an embodiment, it is possible to improve the performance of a solid-state image sensing device.

BRIEF DESCRIPTION OF THE DRAWINGS

FIG. 4 is a view showing a primary color filter that is one of color filters.

FIG. 5 is a view showing a complementary color filter that is one of color filters.

DETAILED DESCRIPTION

The present invention is explained by dividing it into plural sections or plural embodiments in the following embodiments for convenience sake if necessary but, unless otherwise specified, they are not unrelated to each other and one is in the relationship with a modified example, a detailed explanation, a supplemental explanation, or the like of the all or a part of another.

Further, in the following embodiments, when the number of elements and others (including, the number of pieces, a numerical value, a quantity, a range, and others) are referred to, the number is not limited to the specific number and may be a number smaller or larger than the specific number unless specified specifically or specified obviously in principle to the specific number.

Further, it goes without saying that, in the following embodiments, a constituent component thereof (including an element step and others) is not necessarily essential except the case of being specified specifically or being considered obviously as essential in principle.

Likewise, in the following embodiments, when a shape, positional relationship, and others of a constituent component and others are referred to, a shape close or similar to the shape is substantially included in the shape except the case of being specified specifically or being considered obviously as otherwise in principle. The same shall apply to the aforementioned numerical value and range.

In all the drawings for explaining the embodiments, an identical member is represented by an identical symbol in principle and repetitive explanations are avoided. Further, for better understanding of a drawing, hatching may be used even in a plan view in some cases.

(Embodiment 1)

<Schematic Configuration of Image Sensor (Solid-State Image Sensing Device)>

Figure 1:
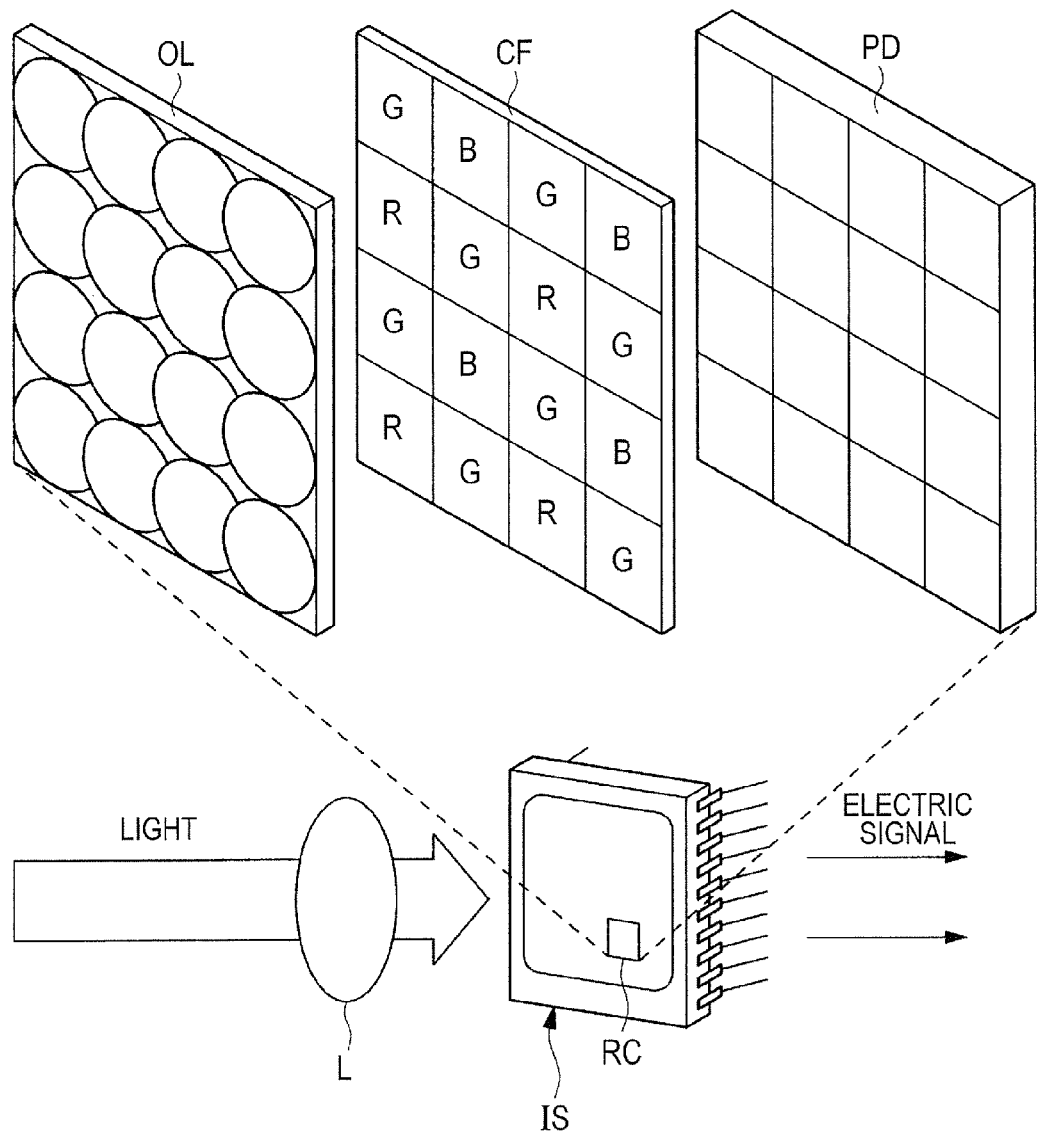
FIG. 1 is a schematic view showing a situation of converting light into an electric signal in an image sensor.

In Embodiment 1, an image sensor (solid-state image sensing device) to take an image is explained in reference to a drawing. Firstly, the schematic configuration of an image sensor is explained. An image sensor is an element to convert light inputted in the image sensor into an electric signal. FIG. 1 is a schematic view showing a situation of converting light into an electric signal in an image sensor. For example as shown in FIG. 1, light emitted from an object enters a lens L and forms an image. An image sensor IS is arranged at the focusing location of the lens L and an image focused by the lens L is projected to the image sensor IS. The image sensor IS converts the light into an electric signal when it is irradiated with the light. Then an image is created by applying signal processing to the electric signal outputted from the image sensor IS. In this way, the image sensor IS has the function of converting incident light into an electric signal and outputting the electric signal.

When a light receiving face RC of the image sensor IS is enlarged, it is understood that a microlens OL, a color filter CF, and a photodiode PD are arranged at the light receiving face RC of the image sensor IS. That is, it is understood that the image sensor IS has the microlens OL, the color filter CF, and the photodiode PD. The function of each of the constituent components configuring the image sensor IS is hereunder explained in sequence.

<Configuration and Function of Microlens>

Figure 2:
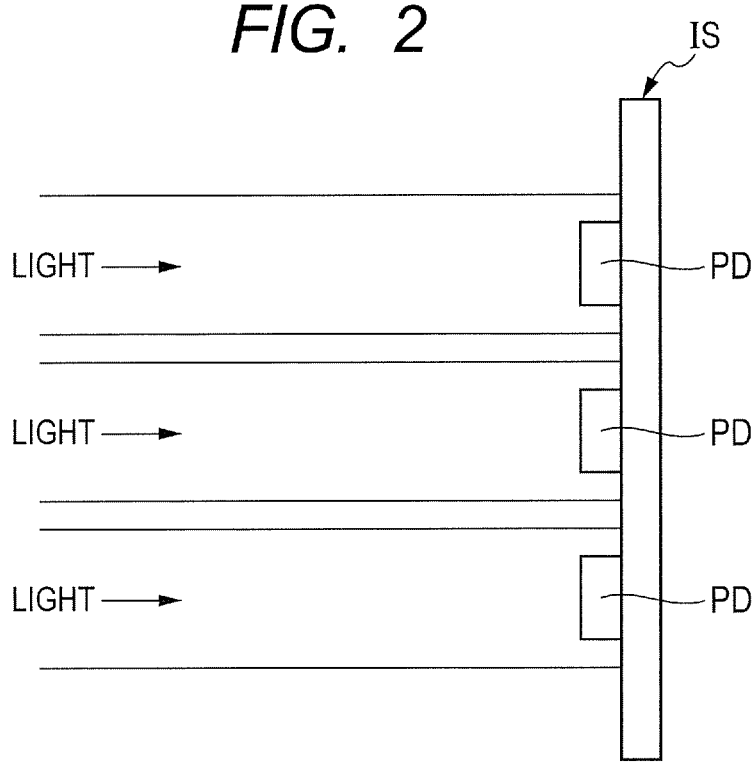
FIG. 2 is a view schematically showing a configuration in the case of not installing a microlens in an image sensor.

Firstly, a microlens OL is explained. FIG. 2 is a view schematically showing a configuration in the case of not installing a microlens OL in an image sensor IS. As shown in FIG. 2, in the case of not installing a microlens OL in an image sensor IS, light entering the image sensor IS is projected not only to photodiodes PD arranged on the light receiving face of the image sensor IS but also to the peripheral region of the photodiodes PD. That is, a plurality of photodiodes PD are arrayed over the light receiving face of the image sensor IS and individual photodiodes PD are arrayed at certain intervals. Consequently, not all the light entering the image sensor IS is projected to the photodiodes PD and the spaces between the photodiodes PD are also irradiated.

Although the light entering the photodiodes PD can be converted into electric signals, the light entering the spaces between the plural photodiodes PD is not projected to the photodiodes PD and hence cannot be converted into an electric signal. That is, the light entering the spaces between the plural photodiodes PD is wasted. It is desirable therefore to configure the image sensor IS so as to be able to convert light entering the image sensor IS into an electric signal as much as possible but it is obvious that the light that is not converted into an electric signal in the image sensor IS and is wasted increases in the case of not installing a microlens OL in the image sensor IS.

As a method for solving the problem, it is conceivable to arrange photodiodes PD with no space but a scanning circuit or the like for transferring electric charges converted at the individual photodiodes PD has to be installed and hence spaces always exist between the plural photodiodes PD. For example, in the case of forming an image sensor IS with a large photodiode PD, it is possible to eliminate a space at a light receiving face but the resolution of an image is not obtained in this case. Consequently, it is necessary to arrange a plurality of small photodiodes PD independently from each other as many as possible at the light receiving face in order to improve the resolution of an image. On this occasion, it is necessary to: convert an electric charge from each of the photodiodes PD into an electric signal independently; and form spaces (an insulation region) at certain intervals so that the individual photodiodes PD may be electrically isolated. Consequently, certain spaces are formed between the individual photodiodes PD and hence it is difficult to completely eliminate the spaces between the photodiodes PD.

Figure 3:
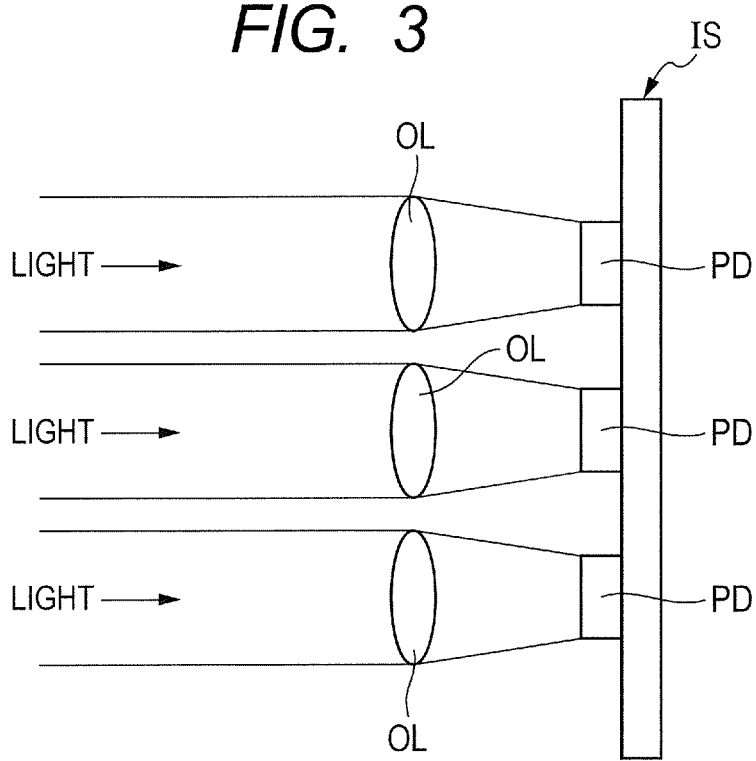
FIG. 3 is a schematic view showing an example of arranging microlenses in front of photodiodes.

To cope with that, a microlens OL is installed in an image sensor IS in order to convert light entering the image sensor IS into an electric signal efficiently. FIG. 3 is a schematic view showing an example of arranging microlenses OL in front of photodiodes PD. As shown in FIG. 3, a microlens OL is arranged in response to each of a plurality of photodiodes PD. That is, microlenses OL of the same number as photodiodes PD are arranged. As shown in FIG. 3, light entering an image sensor IS enters microlenses OL. The light entering the microlenses OL converges and is projected aver the photodiodes PD. In this way, the microlenses OL have the function of converging the light entering the image sensor IS and projecting the light over the photodiodes PD. That is, the light that does not enter the photodiodes PD and is projected to the spaces between the photodiodes PD when microlenses OL are not installed can deflect and enter the photodiodes PD by installing the microlenses OL. That is, the microlenses OL have the function of converging incident light and projecting the light over the photodiodes PD. Consequently, by installing the microlenses OL in the image sensor IS, it is possible to: focus light projected to spaces between the photodiodes PD on the photodiodes PD; and hence convert the light entering the image sensor IS into an electric signal efficiently.

<Configuration and Function of Color Filter>

Figures 4, 5:
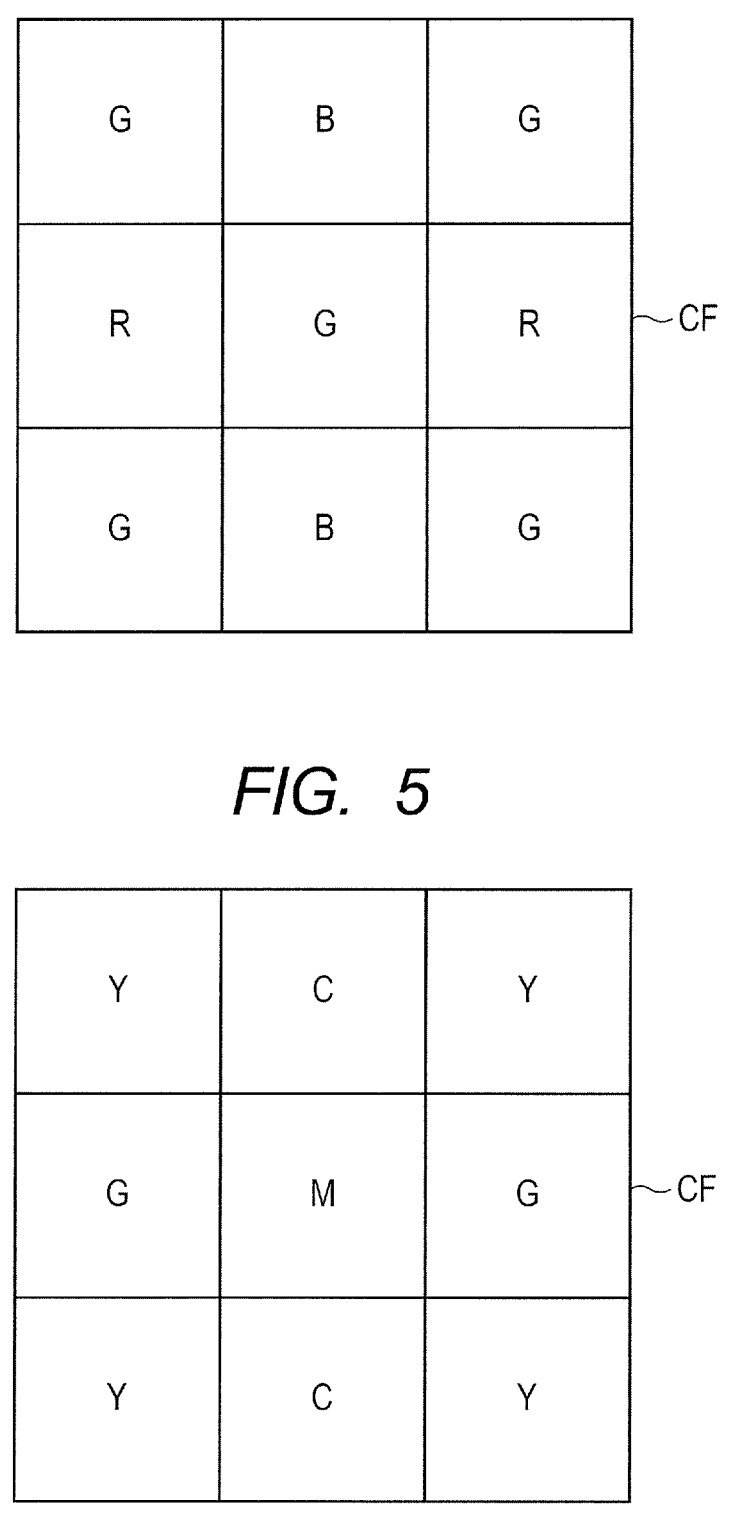

Successively, a color filter CF is explained. Originally a photodiode PD to convert light into an electric signal does not have the function of identifying color and can only identify light and dark. Consequently, all the images taken by an image sensor are monochrome when only a photodiode PD is used. For the reason, a color filter CF is installed in an image sensor IS so as to be able to generate a color image by the image sensor. Human eyes also sense only the three primary colors of "red", "green", and "blue" but sense all colors by adjusting the light quantities of the three primary colors. This is called "additive color mixture of light's three primary colors". For example, if "red" and "green" are the same light quantities, "yellow" is generated. That is, in the state where "red" and "green" are the same light quantities and the light quantity of "blue" is zero, a yellow color that is the complementary color of "blue" is generated. Then when "red", "green", and "blue" are the same light quantities, a white color is generated. In contrast, when the light quantities of all of "red", "green", and "blue" are zero, a black color is generated. A filter formed by using the principle is a color filter CF shown in FIG. 4. In FIG. 4, a primary color filter that is one of color filters CF is shown. The primary color filter is a filter using the three primary colors of RGB (Red, Green, and Blue). By placing the primary color filter in front of photodiodes PD, the photodiodes PD corresponding to the respective colors are obtained. For example, a photodiode PD having a red filter in the front detects a light quantity for a red color and a photodiode PD having a green filter in the front detects a light quantity for a green color. Further, a photodiode PD having a blue filter in the front detects a light quantity for a blue color. Then various colors can be generated in accordance with the light quantity of a photodiode PD for a red color, the light quantity of a photodiode PD for a green color, and the light quantity of a photodiode PD for a blue color.

Here, red filters, green filters, and blue filters configuring a color filter CF are not simply arranged, but are arranged in accordance with a basic pattern represented by Bayer array shown in FIG. 4 for example. That is, a color filter CF is configured by repeating a basic pattern formed by combining red filters, green filters, and blue filters.

A primary filter using the three primary colors of RGB has a good reproducibility of color in an image but has the side effects of poor sensitivity of an image sensor IS and weak imaging at a dark site. Consequently, a primary color filter is increasingly used for a large image sensor IS having good sensitivity.

Meanwhile, as a color filter CF, besides a primary color filter using the three primary colors of RGB, there is a filter called a complementary color filter. A complementary color filter comprises four kinds of colors including cyan (C), magenta (M), yellow (Y), and green (G) as shown in FIG. 5 for example. In an image sensor using a complementary color filter however, CMYG has to be converted into RGB in consideration of the fact that a human being actually sees a taken image but a problem here is that noises are caused at the conversion. A complementary color filter however has an advantage that it has a higher sensitivity than a primary color filter and hence is increasingly used for an image sensor IS of a small size (in other words, low sensitivity).

<Photodiode>

Figure 6:
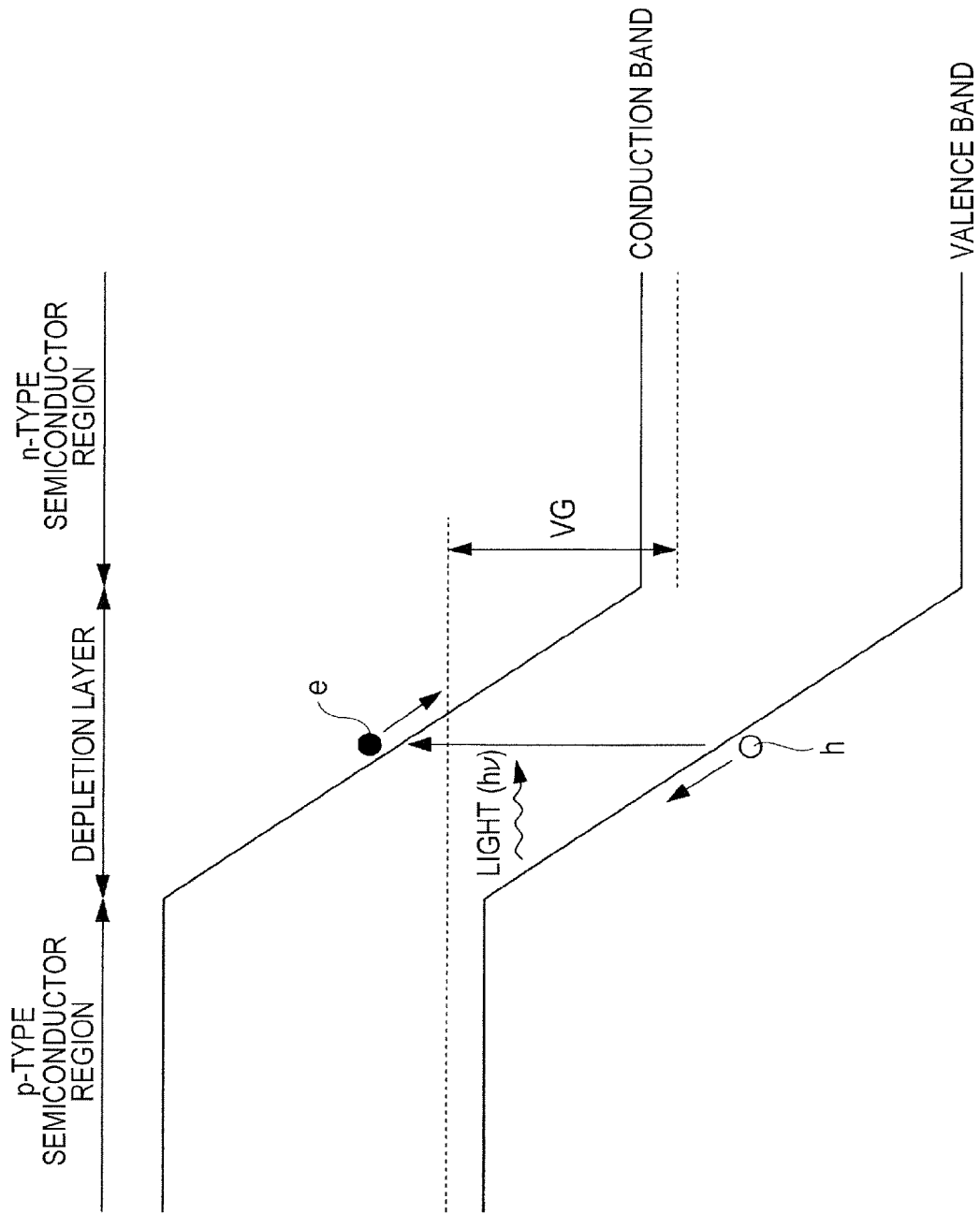
FIG. 6 is a view showing a band structure of a diode by p-n junction.

Successively, the configuration of a photodiode PD is explained. A photodiode PD functions as a photoelectric conversion section to generate an electric charge when it is irradiated with light. A photodiode PD having such a function can comprise a diode by p-n junction for example. FIG. 6 is a view showing a band structure of a diode by p-n junction. As shown in FIG. 6, the left side region is a p-type semiconductor region and the right side region is an n-type semiconductor region. Then the boundary of the p-type semiconductor region and the n-type semiconductor region is a center region and forms a depletion layer. In a diode by p-n junction configured in this way, when light (hv) having an energy of not less than a band gap is projected to a depletion layer for example, the light is absorbed by the depletion layer. Concretely, light is absorbed by an electron existing in the valence band of a band and the electron thereby acquires an energy not less than the band gap. Then the electron having acquired an energy not less than the band gap overcomes the band gap and moves to the conduction band of the band. As a result, an electron-hole pair comprising the electron e having moved to the conduction band and a positive hole h generated at the valence band by the movement of the electron to the conduction band is generated. Then the generated electron e and positive hole h are accelerated by an inverse direction voltage VG applied to a photodiode PD. That is, usually a photodiode PD is used by applying an inverse direction voltage VG to a diode by p-n junction. An inverse direction voltage VG is a voltage applied in the direction of increasing a barrier by p-n junction. Concretely, a positive voltage is applied to an n-type semiconductor region and a negative voltage is applied to a p-type semiconductor region. By adopting such a configuration, for example an electron e and a positive hole h generated at a depletion layer are accelerated by a high electric field by an inverse direction voltage VG. As a result, it is possible to: reduce the proportion of the recombination of the electron e and the positive hole h; and secure a sufficient electric current. The photodiode PD is configured in this way.

<Device Structure of Light Receiving Section>

Figure 7:
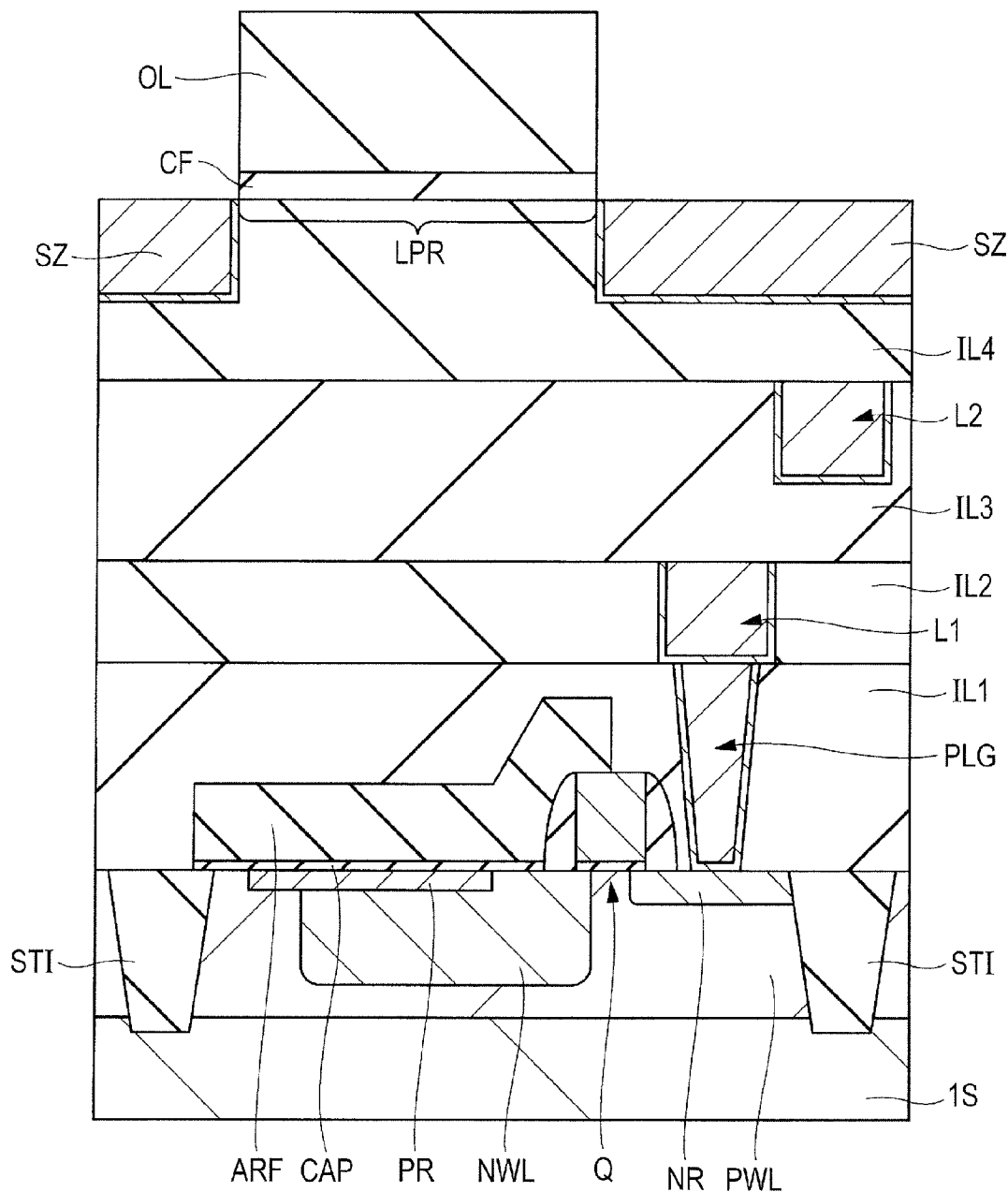
FIG. 7 is a sectional view showing an example of the device structure of a light receiving section.

Successively, the device structure of a light receiving section of an image sensor is explained. FIG. 7 is a sectional view showing an example of the device structure of a light receiving section. In FIG. 7, for example, a semiconductor substrate 1S into which an n-type impurity (donor) such as phosphor (P) or arsenic (As) is introduced is placed and element isolation regions STI are formed over the surface (principal face, element forming face) of the semiconductor substrate IS. An active region is partitioned by the element isolation regions STI and a light receiving section is formed in the partitioned active region. Concretely, in the semiconductor substrate 1S, a p-type well PWL into which a p-type impurity (accepter) such as boron is introduced is formed and an n-type well NWL into which an n-type impurity such as phosphor (P) or arsenic (As) is introduced is formed in the manner of being enclosed by the p-type well PWL. A photodiode (p-n junction diode) comprises the p-type well PWL ($p^-$-type semiconductor region) and the n-type well NWL ($n^-$-type semiconductor region). Then further, a $p^+$-type semiconductor region PR is formed over a part of the surface of the n-type well NWL. The $p^+$-type semiconductor region PR is a region formed with the aim of inhibiting the generation of an electron based on interface states formed many over the surface of the semiconductor substrate 1S. That is, in the surface region of the semiconductor substrate 1S, an electron is generated by the influence of an interface state even in the state of not being irradiated with light and a dark current is caused to increase. For the reason, by forming the $p^+$-type semiconductor region PR having positive holes as a majority carrier over the surface of the n-type well NWL having electrons as a majority carrier, the generation of an electron in the state of not being irradiated with light is inhibited and the increase of a dark current is inhibited.

Successively, a gate insulation film is formed over the semiconductor substrate 1S in the manner of planarly overlapping with a part of the n-type well NWL and a gate electrode is formed over the gate insulation film. Then sidewall spacers are formed over sidewalls on both the sides of the gate electrode. For example, the gate insulation film comprises a silicon oxide film, but is not limited to it, and may also comprise a high permittivity film having a higher permittivity than the silicon oxide film. For example, the gate insulation film may also comprise a hafnium-system insulation film formed by introducing lanthanum oxide into hafnium oxide. Further, the gate electrode can comprise for example a polysilicon film and the sidewalls can comprise for example a silicon oxide film, a silicon nitride film, or a laminated film of a silicon oxide film and a silicon nitride film.

Successively, in the semiconductor substrate 1S matching the gate electrode, an $n^+$-type semiconductor region NR to be a drain region is formed. The $n^+$-type semiconductor region NR comprises for example a semiconductor region into which an n-type impurity such as phosphor (P) or arsenic (As) is introduced.

In this way, a photodiode and a transfer transistor Q are formed over the semiconductor substrate 1S. Concretely, a photodiode comprises the p-type well PWL and the n-type well NWL and the transfer transistor Q has the n-type well NWL as a source region and the $n^+$-type semiconductor region NR formed over the semiconductor substrate 1S apart from the n-type well NWL at a prescribed distance as a drain region. Then a region interposed between the source region and the drain region comes to be a channel forming region and the gate electrode is formed over the channel forming region through the gate insulation film. In this way, the transfer transistor Q having the source region, the drain region, the channel forming region, the gate insulation film, and the gate electrode is formed. Then it is obvious that the photodiode and the transfer transistor Q formed in the active region of the semiconductor substrate 1S share the re-type well NWL and are coupled electrically.

Here, it is also possible to form a silicide film over the surface of the drain region ($n^+$-type semiconductor region NR) of the transfer transistor Q. Thus it is possible to reduce the contact resistance between the drain region and a plug PLG for example. Here, the silicide film can comprise for example a nickel platinum silicide film, a nickel silicide film, a titanium silicide film, a cobalt silicide film, a platinum silicide film, or the like.

Successively, a wiring structure formed over the photodiode and the transfer transistor Q formed over the semiconductor substrate 1S is explained in reference to FIG. 7. In FIG. 7, a cap insulation film CAP is formed over the surface of the photodiode (the surfaces of the n-type well NWL and the $p^+$-type semiconductor region PR). The cap insulation film CAP has the function of keeping the surface characteristic (interface characteristic) of the semiconductor substrate 1S well and comprises for example a silicon oxide film or silicon nitride film. An antireflective film ARF is formed over the cap insulation film CAP and the antireflective film ARF comprises for example a silicon oxynitride film.

Successively, an interlayer insulation film IL1 is formed in the manner of covering the semiconductor substrate 1S including the gate electrode and the antireflective film ARF, and the plug PLG passing through the interlayer insulation film IL1 and reaching the $n^+$-type semiconductor region NR (drain region) is formed. The interlayer insulation film IL1 comprises for example a silicon oxide film using TEOS (Tetra Ethyl Ortho Silicate) as the raw material and the plug PLG is formed by embedding a barrier conductive film comprising for example a titanium film and a titanium nitride film formed over the titanium film (titanium film/titanium nitride film) and a tungsten film formed over the barrier conductive film in a contact hole formed in the interlayer insulation film IL1.

Then an interlayer insulation film IL2 for example is formed over the interlayer insulation film IL1 in which the plug PLG is formed and a wire L1 is formed in the interlayer insulation film IL2. For example, the interlayer insulation film IL2 comprises for example a silicon oxide film, but is not limited to it, and can also comprise a low permittivity film having a lower permittivity than the silicon oxide film. As the low permittivity film, an SiOC film can be named for example. Further, the wire L1 comprises for example a copper wire and can be formed by a damascene method. Here, the wire L1 is not limited to a copper wire and can also comprise an aluminum wire. Successively, an interlayer insulation film IL3 comprising for example a silicon oxide film or a low permittivity film is formed over the interlayer insulation film IL2 in which the wire L1 is formed and a wire L2 is formed in the interlayer insulation film IL3. Further, an interlayer insulation film IL4 is formed over the interlayer insulation film IL3 in which the wire L2 is formed and a light shielding band SZ is formed in the interlayer insulation film IL4.

Here, the wires L1 and L2 and the light shielding band SZ are formed so as not to planarly overlap with the photodiode and a light transmissive section LPR is formed in a region planarly overlapping with the photodiode. The purpose is not to shield light entering the photodiode with the wires L1 and L2 and the light shielding zone SZ. Then a microlens OL is mounted over the light transmissive section LPR through a color filter CF. Here, the light shielding zone SZ is installed for isolating light entering photodiodes adjacent to each other.

That is, the light shielding zone SZ has the function of inhibiting the light leaking between adjacent light receiving sections from entering.

The light receiving section is configured in this way and the operations are briefly explained hereunder. In FIG. 7, when the light receiving section is irradiated with light, firstly the incident light passes through the microlens OL and the color filter CF. Successively, the light passes through the light transmissive section LPR partitioned by the light shielding zone SZ and further, after passing through the interlayer insulation films IL4 to IL1 that are transparent to visible light, enters the antireflective film ARF. At the antireflective film ARF, the incident light is inhibited from reflecting and a sufficient quantity of the incident light enters the photodiode. At the photodiode, since the energy of the incident light is larger than the band gap of silicon, the incident light is absorbed by photoelectric conversion and electron-hole pairs are generated. The electrons generated on this occasion are accumulated in the n-type well NWL. Then at an appropriate timing, the transfer transistor Q is turned on. Concretely, a voltage not lower than a threshold value is applied to the gate electrode of the transfer transistor Q. Then a channel region (n-type semiconductor region) is formed in the channel forming region immediately under the gate insulation film, and the source region (n-type well NWL) and the drain region ($n^+$-type semiconductor region NR) of the transfer transistor Q electrically communicate with each other. As a result, the electrons accumulated in the n-type well NWL reach the drain region through the channel region, travel the wiring layer through the drain region, and are taken out to an exterior circuit. The light receiving section operates in this way.

<Circuit Configuration of Pixel>

Figure 8:
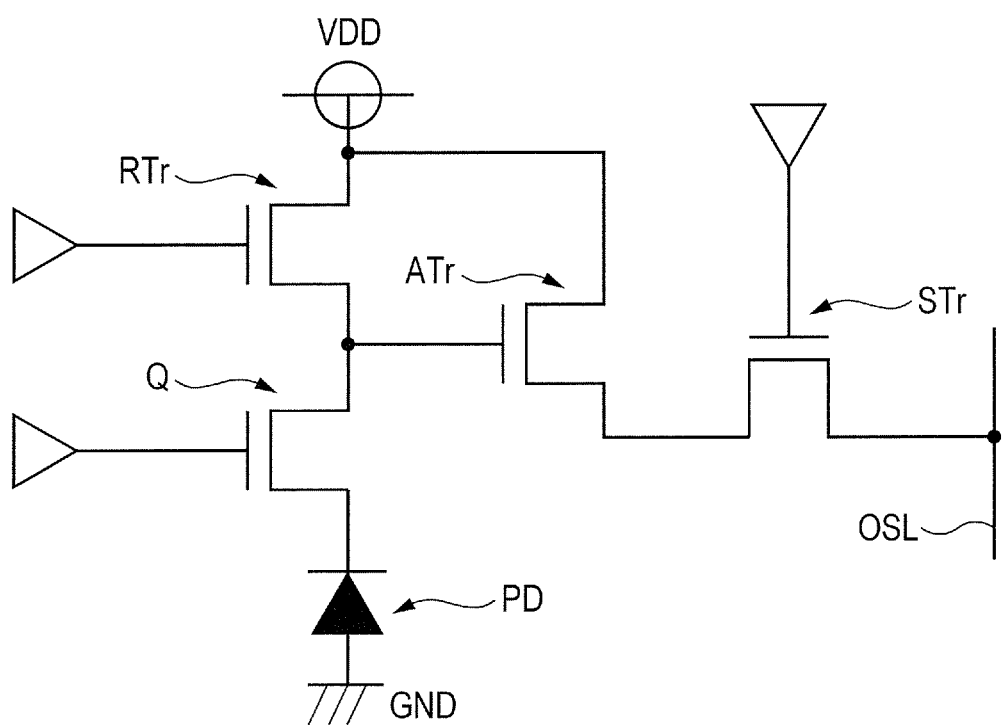
FIG. 8 is a circuit diagram showing a circuit configuration of a pixel.

Successively, the circuit configuration of each of a plurality of pixels configuring an image sensor is explained. FIG. 8 is a circuit diagram showing the circuit configuration of a pixel. In FIG. 8, a pixel includes a photodiode PD, a transfer transistor Q, a reset transistor RTr, an amplification transistor ATr, and a select transistor STr. The photodiode PD functions as a photoelectric conversion section to convert incident light entering the pixel into an electric charge and the transfer transistor Q has the function of transferring the electric charge converted at the photodiode PD. Further, the reset transistor RTr functions as a transistor for resetting the electric charge and the amplification transistor ATr has the function of amplifying a voltage signal based on the electric charge transferred by the transfer transistor Q. Furthermore, the select transistor STr has the function of outputting the voltage signal amplified at the amplification transistor ATr to an output signal line OSL.

In FIG. 8, an anode of the photodiode PD is coupled to a reference potential (GND) and a cathode of the photodiode PD is electrically coupled to a source of the transfer transistor Q. Then a drain of the transfer transistor Q is electrically coupled to a source of the reset transistor RTr and a drain of the reset transistor RTr is electrically coupled to a power supply potential (VDD). Further, the drain of the transfer transistor Q is electrically coupled to a gate electrode of the amplification transistor ATr and a drain of the amplification transistor ATr is electrically coupled to the power supply potential (VDD) together with the drain of the reset transistor RTr. That is, the amplification transistor is arranged so as to be a source follower. Meanwhile, a source of the amplification transistor ATr is electrically coupled to the select transistor STr and the select transistor STr is electrically coupled to the output signal line OSL. Here, the case where the ratio of an output voltage outputted from the amplification transistor to an input voltage inputted to the amplification transistor is around one is also regarded as included in the term "amplification" cited in the present specification.

The circuit configuring a pixel of an image sensor is configured as stated above and the operations thereof are briefly explained hereunder. Firstly, an electric charge is generated from incident light by the photodiode PD and the electric charge is accumulated in the photodiode PD. Then when the transfer transistor Q is turned on, the electric charge accumulated in the photodiode PD is transferred to the gate electrode of the amplification transistor ATr through the transfer transistor Q. Successively, a voltage signal based on the electric charge is amplified by the amplification transistor ATr. Then when the select transistor STr is turned on, the voltage signal amplified by the amplification transistor ATr is outputted to the output signal line OSL. In this way, it is possible to take out a voltage signal corresponding to incident light from a pixel. Here, by turning on the reset transistor RTr, the electric charge accumulated in the photodiode PD is taken out not to the output signal line OSL but to the power source potential side and the reset operation is carried out.

<Layout Configuration of Pixel>

Figure 9:
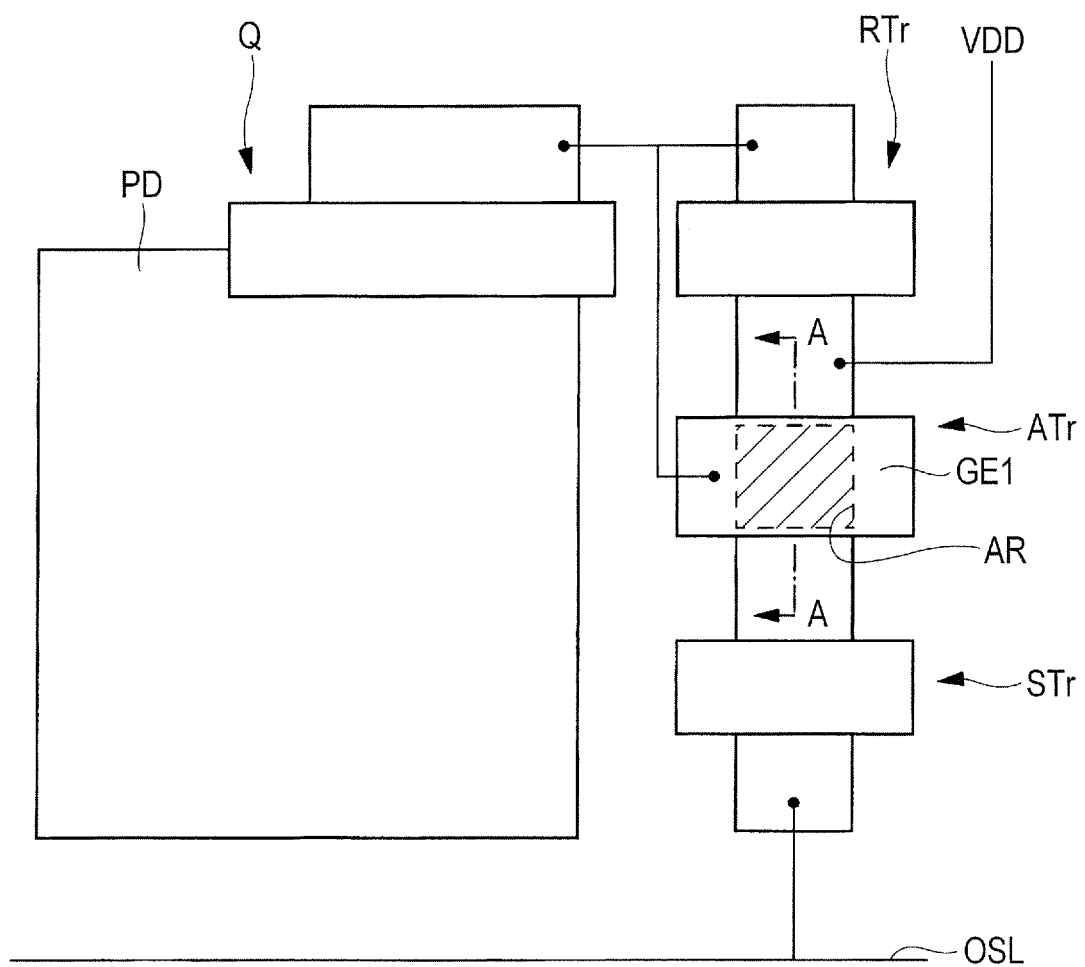
FIG. 9 is a plan view showing a schematic layout configuration of a pixel according to Embodiment 1.

Successively, the layout configuration of a pixel is explained. FIG. 9 is a plan view showing a schematic layout configuration of a pixel according to Embodiment 1. In FIG. 9, a pixel in a plurality of pixels formed in a pixel array region (image sensing region) in a semiconductor substrate is shown. As shown in FIG. 9, in a pixel, a photodiode PD functioning as a photoelectric conversion section to convert incident light into an electric charge and a transfer transistor Q to transfer the electric charge generated at the photodiode PD are integrally arranged. Further, in the pixel, a reset transistor RTr for reset operation, an amplification transistor ATr to amplify a voltage signal (electric signal) based on an electric charge, and a select transistor STr to select the pixel are arranged integrally in the manner of being isolated from the photodiode PD and the transfer transistor Q. Then in FIG. 9, the photodiode PD, the transfer transistor Q, the reset transistor RTr, the amplification transistor ATr, and the select transistor STr are arranged so as to configure the circuit shown in FIG. 8.

Here, when attention is focused on the amplification transistor ATr, in FIG. 9, a gate electrode GE1 is a constituent component of the amplification transistor ATr and a region in plan view overlapping with a channel region in the gate electrode GE1 of the amplification transistor ATr is shown as a region AR.

<Device Structure of Amplification Transistor>

Figure 10:
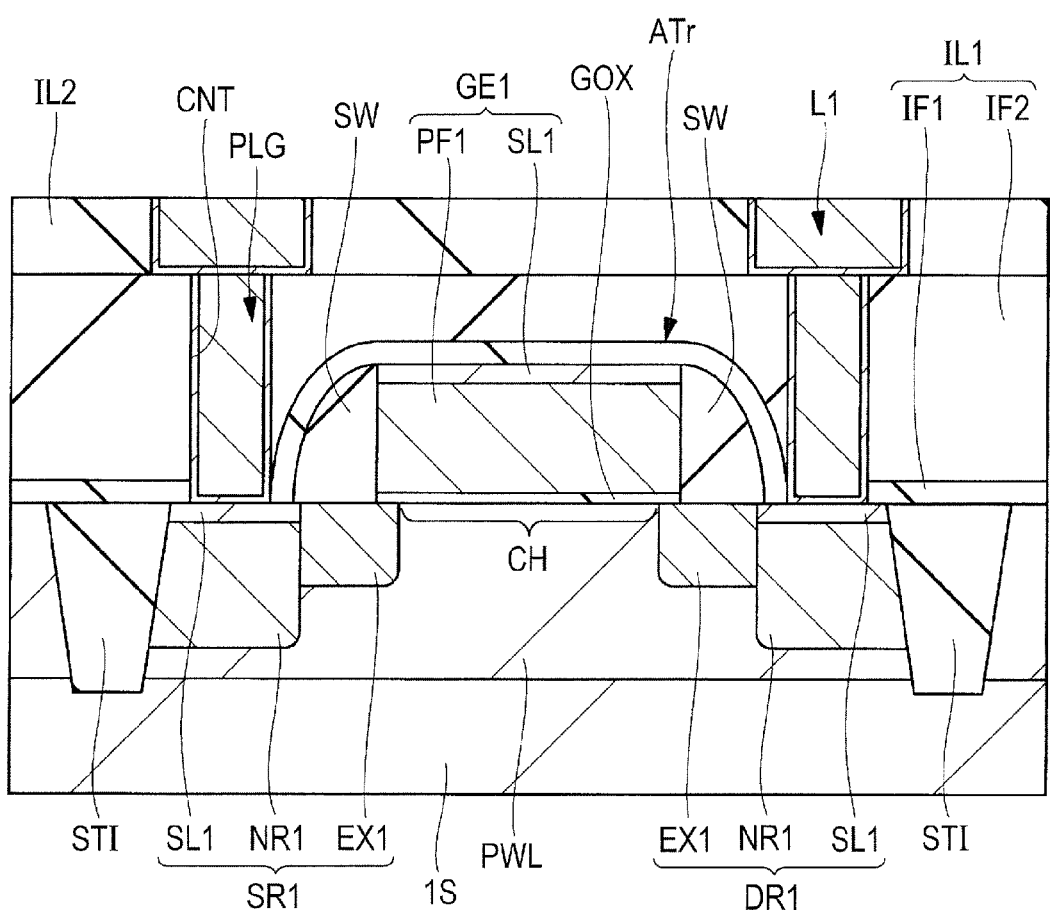
FIG. 10 is a sectional view taken on line A-A in FIG. 9.

The device structure of an amplification transistor ATr is explained hereunder while attention is focused on the amplification transistor ATr. FIG. 10 is a sectional view taken on line A-A in FIG. 9. In FIG. 10, a plurality of element isolation regions STI are formed on the principal face side (surface side) of a semiconductor substrate 1S and a p-type well PWL that is a p-type semiconductor region is formed in an active region partitioned by those element isolation regions STI. In the p-type well PWL, a source region SR1 that is an n-type semiconductor region and a drain region DR1 that is an n-type semiconductor region are formed so as to be isolated from each other. Then a channel region CH that is a p-type semiconductor region is formed in the manner of being interposed between the source region SR1 and the drain region DR1, those being formed isolatedly.

A gate insulation film GOX comprising for example a silicon oxide film or a high permittivity film having a higher permittivity than the silicon oxide film is formed over the channel region CH and a gate electrode GE1 is formed over the gate insulation film GOX. The gate electrode GE1 comprises for example a polysilicon film PF1 and a silicide film SL1. The silicide film SL1 can comprise for example a nickel platinum silicide film, a nickel silicide film, a titanium silicide film, a cobalt silicide film, a platinum silicide film, or the like.

Sidewall spacers SW comprising for example a silicon oxide film are formed over sidewalls on both the sides of the gate electrode GE1. Then the source region SR1 comprises a low concentration impurity diffusion region EX1 formed in the manner of matching the gate electrode GE1, a high concentration impurity diffusion region NR1 formed in the manner of matching the sidewall spacers SW, and a silicide film SL1 formed over the surface of the high concentration impurity diffusion region NR1. Likewise, the drain region DR1 comprises a low concentration impurity diffusion region EX1 formed in the manner of matching the gate electrode GE1, a high concentration impurity diffusion region NR1 formed in the manner of matching the sidewall spacers SW, and a silicide film SL1 formed over the surface of the high concentration impurity diffusion region NR1.

The amplification transistor ATr according to Embodiment 1 is configured as stated above, an insulation film IF1 comprising for example a silicon nitride film is formed in the manner of covering the amplification transistor ATr and an insulation film IF2 comprising for example a silicon oxide film is formed over the insulation film IF1. An interlayer insulation film IL1 comprises the insulation film IF1 and the insulation film IF2. Then a contact hole CNT passing through the interlayer insulation film IL1 and reaching the source region SR1 or the drain region DR1 is formed in the interlayer insulation film IL1 and a plug PLG is formed in the manner of being embedded in the contact hole CNT. The plug PLG can comprise for example a titanium/titanium nitride film formed over the inner wall of the contact hole CNT and a tungsten film embedded in the contact hole CNT.

An interlayer insulation film IL2 comprising for example a silicon oxide film is formed over the interlayer insulation film IL1 in which the plug PLG is formed and a wire L1 is formed in the interlayer insulation film IL2. The wire L1 is formed so as to be electrically coupled to the plug PLG. Further, a multilayered wiring structure is formed above the wire L1 but the explanation is omitted. In this way, the amplification transistor ATr is formed over the semiconductor substrate 1S and the wire L1 is formed above the amplification transistor ATr.

<Feature of Embodiment 1>

Here, a feature of Embodiment 1 is that, in plan view, fluorine is introduced into a part overlapping with a channel region CH in a gate electrode GE1 of an amplification transistor ATr and fluorine is not introduced into a semiconductor substrate 1S. Concretely, in FIG. 9 fluorine is introduced into the region AR shown in the gate electrode GE1. In other words, in FIG. 10, whereas fluorine is introduced into the gate electrode GE1 over the channel region CH, fluorine is not introduced into the semiconductor substrate 1S. Thus according to Embodiment 1, it is possible to reduce the baseline noise of an image sensor and inhibit the number of white spots at dark and a dark current from increasing. The reason is explained below.

In an image sensor typified by a CMOS image sensor for example, it is necessary to reduce a baseline noise perceived as a phenomenon of an image not being coal-black even when it is dark. It is known that the baseline noise is strongly correlated with a 1/f noise generated at an amplification transistor ATr included in a pixel. It is therefore effective to reduce the 1/f noise generated at the amplification transistor ATr in order to reduce the baseline noise.

In this context, it is known that it is effective to reduce a dangling bond existing in a gate insulation film GOX of an amplification transistor ATr in order to reduce a 1/f noise of the amplification transistor ATr and, as a method for reducing the dangling bond, there is a method of combining fluorine with the dangling bond. Concretely, it is conceivable to introduce fluorine into an image sensor including the amplification transistor ATr by an ion implantation method.

Meanwhile, as a result of study by the present inventors, it has been found that, among means for introducing fluorine into an image sensor, a means for introducing fluorine particularly into a gate electrode GE1 of an amplification transistor ATr is most effective from the viewpoint of reducing a dangling bond existing in a gate insulation film GOX of the amplification transistor ATr. That is, as a means for introducing fluorine into an image sensor, for example a means for introducing fluorine into the interior of a semiconductor substrate 1S such as a source region SR1 or a drain region DR1 of an amplification transistor ATr is also conceivable. A means for introducing fluorine into a gate electrode GE1 of an amplification transistor ATr however can reduce a dangling bond existing in a gate insulation film GOX of the amplification transistor ATr more effectively than such a means for introducing fluorine.

Figure 11:
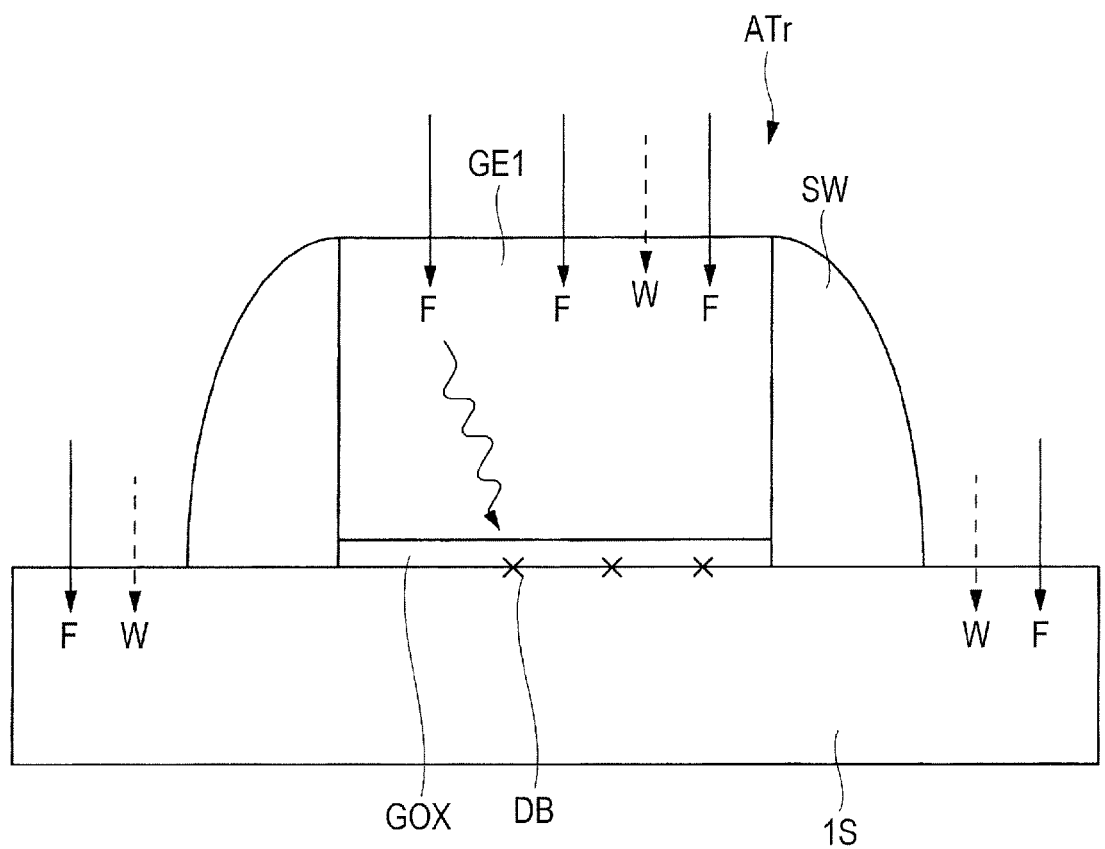
FIG. 11 is a view schematically showing the situation of combining fluorine with dangling bonds existing in a gate insulation film of an amplification transistor.

FIG. 11 is a view schematically showing the situation of combining fluorine with dangling bonds existing in a gate insulation film GOX of an amplification transistor ATr. As shown in FIG. 11, the case of introducing fluorine into both the gate electrode GE1 of the amplifier transistor ATr and the interior of a semiconductor substrate 1S is taken into consideration. In this case, as shown in FIG. 11, dangling bonds DB existing in the gate insulation film GOX are supposed to be likely to be combined with the fluorine introduced into the gate electrode GE1. The reason is that the diffusion distance at which the fluorine introduced into the gate electrode GE1 moves to the dangling bonds DB formed in the gate insulation film GOX is supposed to be shorter than that of the fluorine introduced into the interior of the semiconductor substrate 1S. An additional reason is that, whereas the diffusion direction of the fluorine introduced into the gate electrode GE1 is supposed to be predominantly directed downward where the gate insulation film GOX exists, the diffusion direction of the fluorine introduced into the interior of the semiconductor substrate 1S is supposed to be directed horizontally and downward and the probability of diffusing on a channel region side is supposed to lower. That is, the fluorine introduced into the gate electrode GE1 can be estimated to be likely to be combined with the dangling bonds DB existing in the gate insulation film GOX of the amplification transistor ATr by the synergy effect of the facts that the diffusion distance to the dangling bonds DB formed in the gate insulation film GOX is short and the diffusion to the direction where the gate insulation film GOX exists is predominant. As a result, it is obvious that the means of introducing fluorine into the gate electrode GE1 of the amplification transistor ATr is useful from the viewpoint of reducing the dangling bonds existing in the gate insulation film GOX of the amplification transistor ATr. In other words, it can be said that the fluorine introduced into the gate electrode GE1 is more likely to be combined with the dangling bonds formed in the gate insulation film GOX than the fluorine introduced into the interior of the semiconductor substrate 1S and contributes largely to the reduction of the dangling bonds DB. By reducing the dangling bonds existing in the gate insulation film GOX of the amplification transistor ATr therefore, it is possible to reduce the 1/f noise of the amplification transistor ATr and finally, from the viewpoint of reducing the baseline noise of the image sensor, it is not necessary to introduce fluorine into the interior of the semiconductor substrate 1S and the reduction of the baseline noise can be attained sufficiently by introducing fluorine into the gate electrode GE1 of the amplification transistor ATr. In still other words, since the dangling bonds planarly overlapping with the channel region are a problem in particular, in order to reduce the baseline noise of the image sensor, it is sufficient if fluorine is introduced at least into the part overlapping with the channel region CH in the gate electrode GE1 of the amplification transistor ATr. In Embodiment 1 therefore, the configuration is devised so that fluorine may be introduced into the part overlapping with the channel region CH in the gate electrode GE1 of the amplification transistor ATr and may not be introduced into the interior of the semiconductor substrate 1S.

By the specific configuration according to Embodiment 1, additional advantages can be obtained. The points are explained hereunder. An ion implantation method is used for introducing fluorine for example but a bad influence by a pollutant (contaminant) contained in an ion beam including fluorine is concerned. That is, as shown in FIG. 11, a pollutant typified for example by tungsten (W) is contained in an ion beam including fluorine and, if a metal atom typified by tungsten (W) intrudes into a semiconductor substrate 1S, the number of white spots at dark and a dark current in an image sensor may increase undesirably. This is presumably caused by the fact that the metal atom having intruded into the semiconductor substrate 1S diffuses and resultantly reaches a photodiode functioning as a photoelectric conversion section and thus a defect level is generated. That is, it is estimated that, when the defect level is generated, in the photodiode, a leak current increases through the defect level and the increase of the leak current leads to the increase of the number of white spots at dark and the dark current.

Consequently, from the viewpoint of inhibiting the number of white spots at dark and a dark current from increasing, it is desirable not to introduce fluorine into the interior of the semiconductor substrate 1S. In this regard, it is useful to introduce fluorine into an image sensor in order to reduce the baseline noise of the image sensor. From this, at a glance, there seems to be the relationship of tradeoff between the reduction of the baseline noise of the image sensor and the inhibition of the increase of the number of white spots at dark and a dark current from the viewpoint of introducing fluorine. As stated above however, in Embodiment 1, it is known that, in order to reduce the baseline noise of the image sensor, it is unnecessary to introduce fluorine into the interior of the semiconductor substrate 1S but it is sufficient at least if fluorine is introduced into the part overlapping with the channel region CH in the gate electrode GE1 of the amplification transistor ATr. That is, in order to reduce the baseline noise of the image sensor, it is only necessary to introduce fluorine into the part overlapping with the channel region CH in the gate electrode GE1 of the amplification transistor ATr and it is unnecessary to introduce fluorine into the interior of the semiconductor substrate 1S. Consequently, by the specific configuration according to Embodiment 1, fluorine is not introduced into the interior of the semiconductor substrate 1S and hence it is possible to inhibit the increase of the number of white spots at dark and a dark current caused by a pollutant intruding when fluorine is introduced. That is, by the specific configuration according to Embodiment 1 of introducing fluorine into the part overlapping with the channel region CH in the gate electrode GE1 of the amplification transistor ATr and not introducing fluorine into the interior of the semiconductor substrate 1S, it is possible to obtain the conspicuous effects of both reducing the baseline noise of the image sensor and inhibiting the number of white spots at dark and a dark current from increasing. As a result, according to Embodiment 1, the performance of the image sensor can be improved.

Here, in Embodiment 1, fluorine is introduced into the part overlapping with the channel region CH in the gate electrode GE1 of the amplification transistor ATr. Even in this case however, it is unlikely that the fluorine introduced into the gate electrode GE1 diffuses up to the interior of the semiconductor substrate 1S and hence, by Embodiment 1, it scarcely occurs that metal atoms having intruded into the semiconductor substrate 1S diffuse, thereby reach the photodiode functioning as the photoelectron conversion section, and cause the number of white spots at dark and a dark current to increase. It is estimated that the number of white spots at dark and a dark current are inhibited from increasing at least by the specific configuration according to Embodiment 1 more than the configuration of introducing fluorine into the interior of a semiconductor substrate 1S and hence it is possible to improve performance by the specific configuration according to Embodiment 1 more than the configuration of introducing fluorine into the interior of the semiconductor substrate 1S.

<Difference in Effect of Insertion Timing of Fluorine Implantation Step>

The image sensor according to Embodiment 1 is configured as stated above and the manufacturing method thereof is explained hereunder. As a result of study by the present inventors however, it has been found that the reduction effect of the 1/f noise of an amplification transistor varies in accordance with insertion timing of a fluorine implantation step and hence explanations are made firstly on this point.

Figure 12:
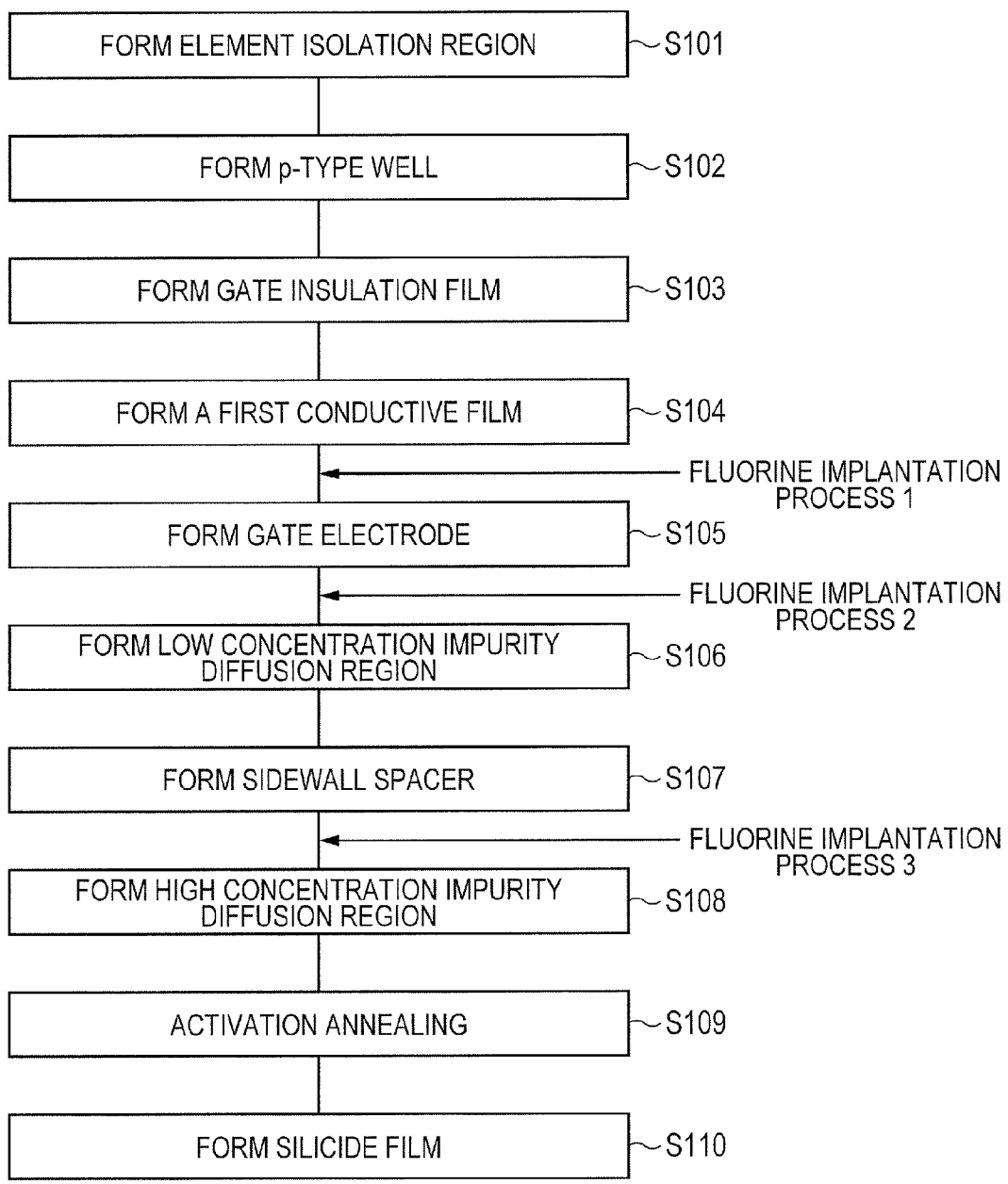
FIG. 12 is a flowchart explaining the flow of a manufacturing step of an amplification transistor included in an image sensor.

FIG. 12 is a flowchart explaining the flow of a manufacturing step of an amplification transistor included in an image sensor. The manufacturing step of an amplification transistor is briefly explained hereunder in reference to the flowchart.

Firstly, after an element isolation region is formed on the principal face side (surface side) of a semiconductor substrate (S101), a p-type well is formed in the semiconductor substrate (S102). Successively, a gate insulation film is formed over the principal face of the semiconductor substrate (S103) and a first conductive film is formed over the gate insulation film (S104). Successively, a gate electrode is formed by processing the first conductive film by a photolithography technology and an etching technology (S105). Then, a low concentration impurity diffusion region is formed in the semiconductor substrate in the manner of matching the gate electrode (S106). Successively, sidewall spacers are formed over sidewalls on both the sides of the gate electrode (S107) and a high concentration impurity diffusion region is formed in the manner of matching the sidewall spacers (S108). Successively, after activation annealing is applied (S109), a silicide film is formed over the surface of the gate electrode and the surface of the high concentration impurity diffusion region (S110). In this way, the amplification transistor can be manufactured.

Here, Embodiment 1 is characterized by injecting fluorine into a part planarly overlapping with a channel region in a gate electrode of an amplification transistor and study on changing the insertion timing of a fluorine implantation step is carried out in the manufacturing step of the amplification transistor.

Concretely, in FIG. 12, the present inventors have studied the case of introducing a fluorine implantation step between the first conductive film forming step (S104) and the gate electrode forming step (S105) (fluorine implantation step 1) and the case of introducing the fluorine implantation step between the gate electrode forming step (S105) and the low concentration impurity diffusion region forming step (S106) (fluorine implantation step 2). Further, in FIG. 12, the present inventors have also studied the case of introducing the fluorine implantation step between the sidewall spacer forming step (S107) and the high concentration impurity diffusion region forming step (S108) (fluorine implantation step 3). The conditions of the fluorine implantation on this occasion are identical in the fluorine implantation steps 1 to 3 and for example the implantation energy of fluorine is 10 keV and the dose quantity is $3 \times 10^{15}/cm^2$.

Figure 13:
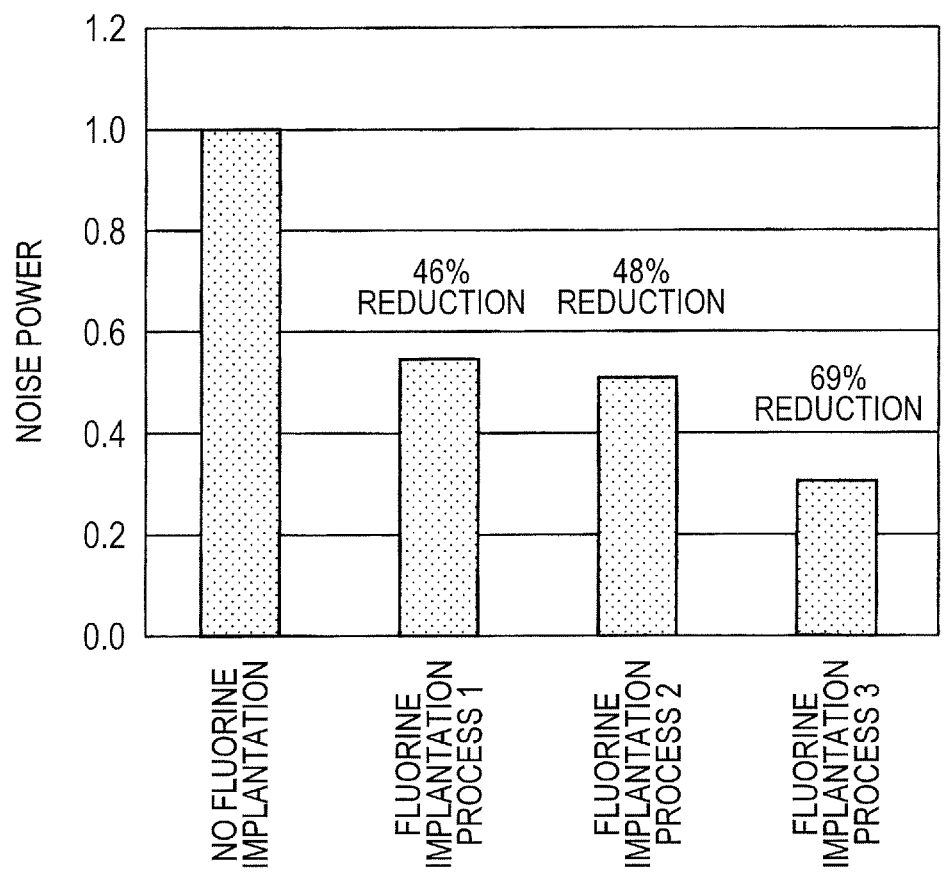
FIG. 13 is a graph showing study results in the case of changing the insertion timing of a fluorine implantation step.

FIG. 13 is a graph showing the study results. In FIG. 13, the vertical axis represents the noise power of the 1/f noise of an amplification transistor and the noise power is shown by a relative value with the noise power of no fluorine implantation being regarded as one. Meanwhile, on the horizontal axis, the cases of no fluorine implantation and the fluorine implantation steps 1 to 3 are shown respectively.

As shown in FIG. 13, it is obvious that the noise power of the amplification transistor at the fluorine implantation step 1 reduces by 46% in comparison with the case of no fluorine implantation and the noise power of the amplification transistor at the fluorine implantation step 2 reduces by 48% in comparison with the case of no fluorine implantation. Further, it is obvious that the noise power of the amplification transistor at the fluorine implantation step 3 reduces by 69% in comparison with the case of no fluorine implantation.

Consequently, it is obvious that, regardless of the insertion timing of the fluorine implantation step, the noise power of an amplification transistor can be reduced in the case of injecting fluorine into the part planarly overlapping with the channel region in the gate electrode of the amplification transistor in comparison with the case of injecting no fluorine into a gate electrode of an amplification transistor. That is, it is obvious that the configuration of injecting fluorine into a gate electrode of an amplification transistor is useful from the viewpoint of reducing the 1/f noise of the amplification transistor and finally reducing the baseline noise of an image sensor.

Then as shown in FIG. 13, it is also obvious that the reduction effect of the 1/f noise of an amplification transistor varies in accordance with the insertion timing of the fluorine implantation step. That is, it is obvious that the noise power of an amplification transistor can be reduced in the insertion timing of any of the fluorine implantation steps 1 to 3 in comparison with the case of no fluorine implantation and in particular the effect of reducing the noise power of an amplification transistor is the maximum in the fluorine implantation step 3. As a result, it is obvious that the configuration of carrying out the implantation of fluorine at the insertion timing shown by the fluorine implantation step 3 is most desirable from the viewpoint of reducing the noise power of an amplification transistor.

As shown in FIG. 13 however, in the configuration of carrying out the implantation of fluorine at the insertion timing shown for example by the fluorine implantation step 1 or the fluorine implantation step 2 too, the noise power of an amplification transistor can be reduced in comparison with the case of no fluorine implantation.

It can be said from this that the technological thought of Embodiment 1 of injecting fluorine into a part planarly overlapping with a channel region in a gate electrode of an amplification transistor is useful regardless of the insertion timing of a fluorine implantation step. In the configuration of carrying out the implantation of fluorine at the insertion timing shown by the fluorine implantation step 3 however, the effect of reducing the noise power of the amplification transistor is the maximum and hence it can be said that the configuration is most desirable from the viewpoint of reducing the noise power of the amplification transistor.

<Manufacturing Step of Amplification Transistor>

Then a manufacturing step of an amplification transistor according to Embodiment 1 is explained hereunder in reference to drawings on the basis of the configuration of carrying out the implantation of fluorine at the insertion timing shown by the fluorine implantation step 3.

Figure 14:
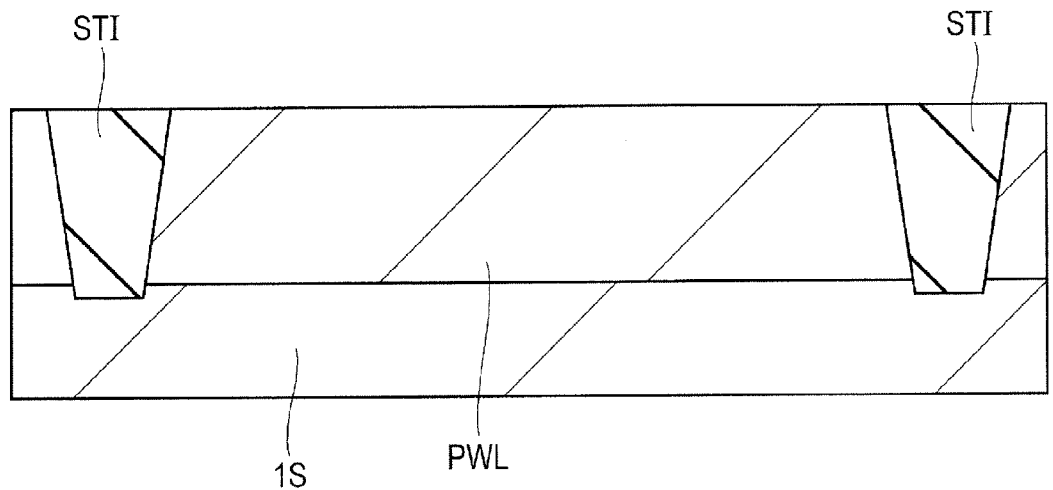
FIG. 14 is a sectional view showing a manufacturing step of a semiconductor device according to Embodiment 1.

Firstly, as shown in FIG. 14, a semiconductor substrate 1S comprising a silicon monocrystal into which a p-type impurity such as boron (B) is introduced is prepared. On this occasion, the semiconductor substrate 1S is in the state of a nearly disk-shaped semiconductor wafer. Then element isolation regions STI to isolate elements are formed over the principal face side (surface side) of the semiconductor substrate 1S. The element isolation regions STI are formed so that elements may not interfere with each other. The element isolation regions STI can be formed for example by a LOCOS (local oxidation of silicon) method or an STI (shallow trench isolation) method. By the STI method for example, an element isolation region STI is formed as follows. That is, an element isolation trench is formed in the semiconductor substrate 1S by a photolithography technology and an etching technology. Then a silicon oxide film is formed over the semiconductor substrate so as to be embedded in the element isolation trench and successively an unnecessary silicon oxide film formed over the semiconductor substrate is removed by a chemical mechanical polishing (CMP) method. In this way, an element isolation region STI having a silicon oxide film embedded only in an element isolation trench can be formed.

Successively, a p-type well PWL is formed by introducing an impurity into an active region isolated by the element isolation regions STI. The p-type well PWL is formed for example by introducing a p-type impurity such as boron into the semiconductor substrate 1S by an ion implantation method.

Successively, a semiconductor region (not shown in the figure) for forming a channel is formed at the surface region of the p-type well PWL. The semiconductor region for forming a channel is formed in order to adjust a threshold voltage for forming the channel.

Figure 15:
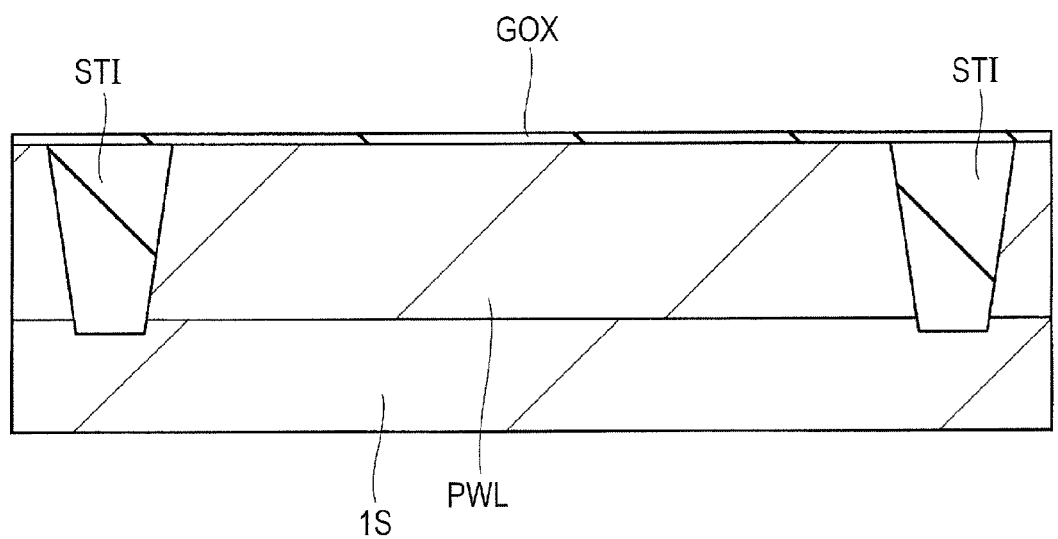
FIG. 15 is a sectional view showing a manufacturing step of the semiconductor device following FIG. 14.

Successively, as shown in FIG. 15, a gate insulation film GOX is formed over the semiconductor substrate 1S. The gate insulation film GOX comprises for example a silicon oxide film and can be formed for example by a thermal oxidization method. Here, the gate insulation film GOX is not limited to the silicon oxide film, can be modified variously, and may also comprise for example a silicon oxynitride (SiON) film. That is, it may have a structure of introducing nitrogen into the gate insulation film GOX. The silicon oxynitride film is highly effective in inhibiting an interface state from being generated in the film and reducing electron trap in comparison with the silicon oxide film. Consequently, it is possible to improve the hot carrier resistance and insulation resistance of the gate insulation film GOX. Further, an impurity hardly penetrates the silicon oxynitride film in comparison with the silicon oxide film. As a result, by using a silicon oxynitride film as the gate insulation film GOX, it is possible to inhibit the variation of a threshold voltage caused by the diffusion of an impurity in the gate electrode toward the side of the semiconductor substrate 1S. The silicon oxynitride film may be formed for example by applying heat treatment to the semiconductor substrate 1S in an atmosphere containing nitrogen such as NO, $NO_2$, or $NH_3$. Otherwise, a similar effect can be obtained also by applying heat treatment to the semiconductor substrate 1S in an atmosphere containing nitrogen after the gate insulation film GOX comprising a silicon oxide film is formed over the surface of the semiconductor substrate 1S and introducing the nitrogen into the gate insulation film GOX.

Further, the gate insulation film GOX may comprise for example a high permittivity film having a higher permittivity than a silicon oxide film. As a high permittivity film having a higher permittivity than a silicon nitride film for example, a hafnium oxide film ($HfO_2$ film) that is one of the hafnium oxides can be used. Further, an HfAlO film formed by adding aluminum to a hafnium oxide film may be used. Furthermore, in place of a hafnium oxide film, another hafnium system insulation film such as a hafnium aluminate film, an HfON film (hafnium oxynitride film), an HfSiO film (hafnium silicate film), an HfSiON film (hafnium silicon oxynitride film), or an HfAlO film can also be used. Moreover, a hafnium system insulation film formed by introducing an oxide, such as a tantalum oxide, a niobium oxide, a titanium oxide, a zirconium oxide, a lanthanum oxide, or an yttrium oxide, into such a hafnium system insulation film can also be used. A hafnium system insulation film, like a hafnium oxide film, has a higher permittivity than a silicon oxide film and a silicon oxynitride film and hence can yield an effect similar to the case of using a hafnium oxide film.

Figure 16:
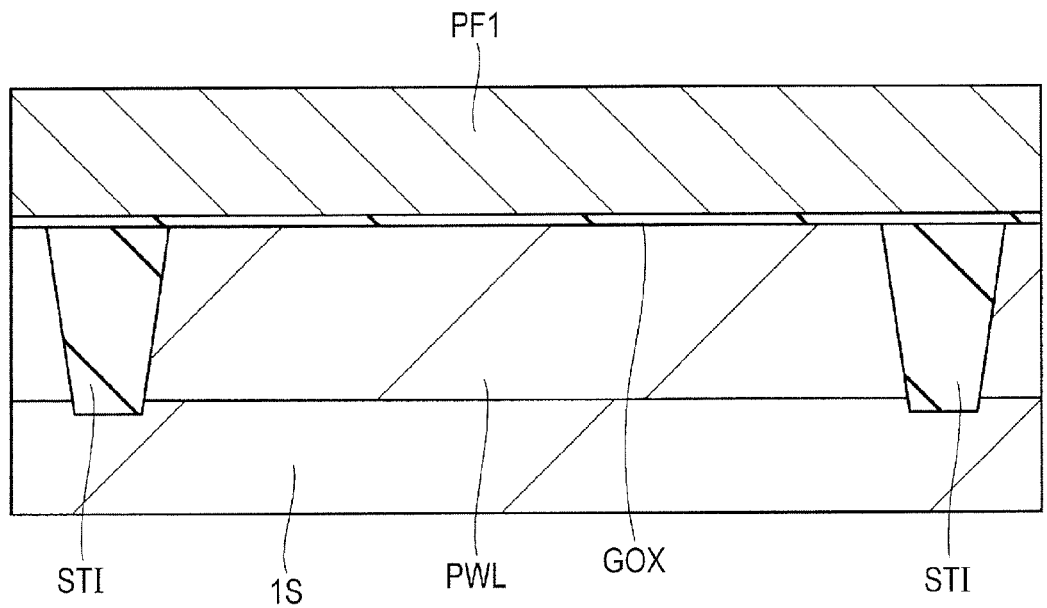
FIG. 16 is a sectional view showing a manufacturing step of the semiconductor device following FIG. 15.

Successively, as shown in FIG. 16, a polysilicon film PF1 is formed over the gate insulation film GOX. The polysilicon film PF1 can be formed for example by a CVD method. Successively, an n-type impurity such as phosphor or arsenic is introduced into the polysilicon film PF1 by the photolithography technology and the ion implantation method.

Figure 17:
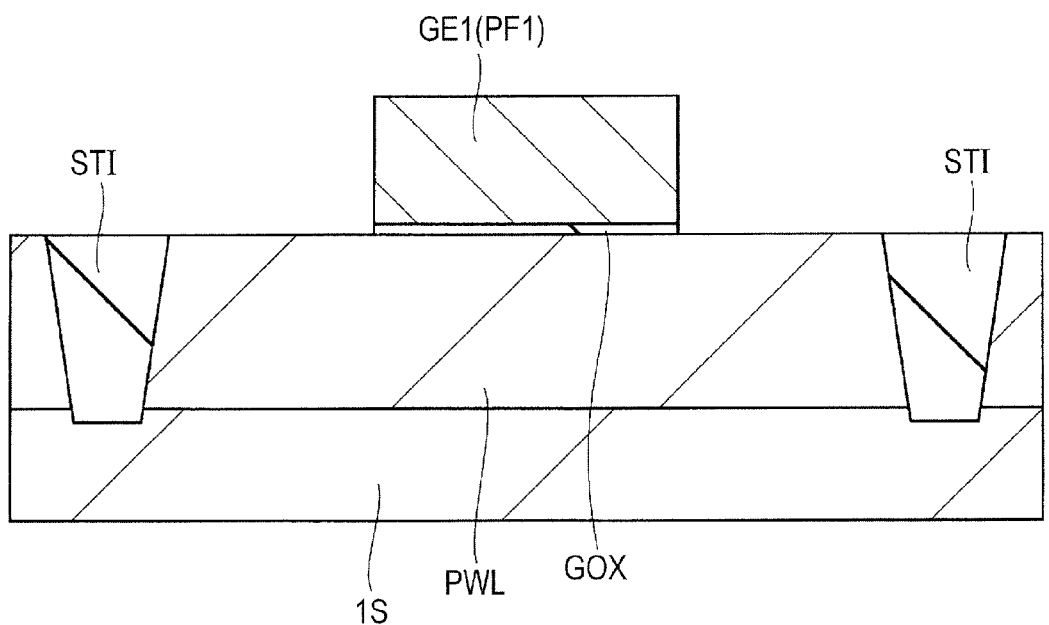
FIG. 17 is a sectional view showing a manufacturing step of the semiconductor device following FIG. 16.

Successively, as shown in FIG. 17, a gate electrode GE1 is formed by processing the polysilicon film PF1 by the photolithography technology and the etching technology. Here, the n-type impurity is introduced into the polysilicon film PF1 configuring the gate electrode GE1. Consequently, it is possible to: make the work function value of the gate electrode GE1 be a value in the vicinity of the conduction band (4.15 eV) of silicon; and hence reduce the threshold voltage of an amplification transistor comprising an n-channel MISFET. Here, although it is not shown in the figure, at this stage for example, ion implantation for forming the p-n junction of a photodiode functioning as a photoelectric conversion section is carried out in each of plural pixels.

Figure 18:
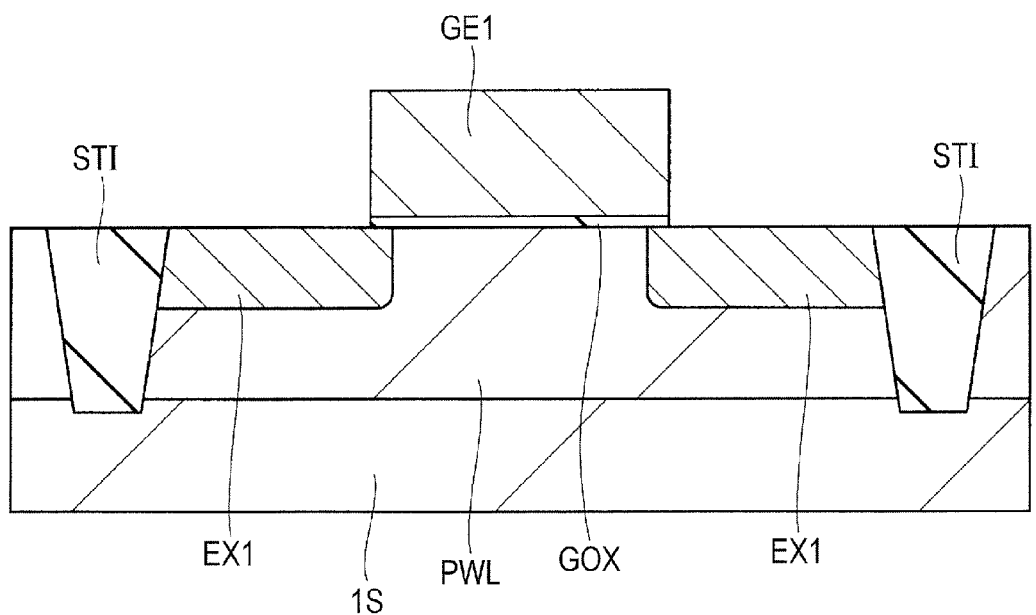
FIG. 18 is a sectional view showing a manufacturing step of the semiconductor device following FIG. 17.

Successively, as shown in FIG. 18, a shallow low concentration impurity diffusion region EX1 matching the gate electrode GE1 is formed by the photolithography technology and the ion implantation method. The shallow low concentration impurity diffusion region EX1 is an n-type semiconductor region.

Figure 19:
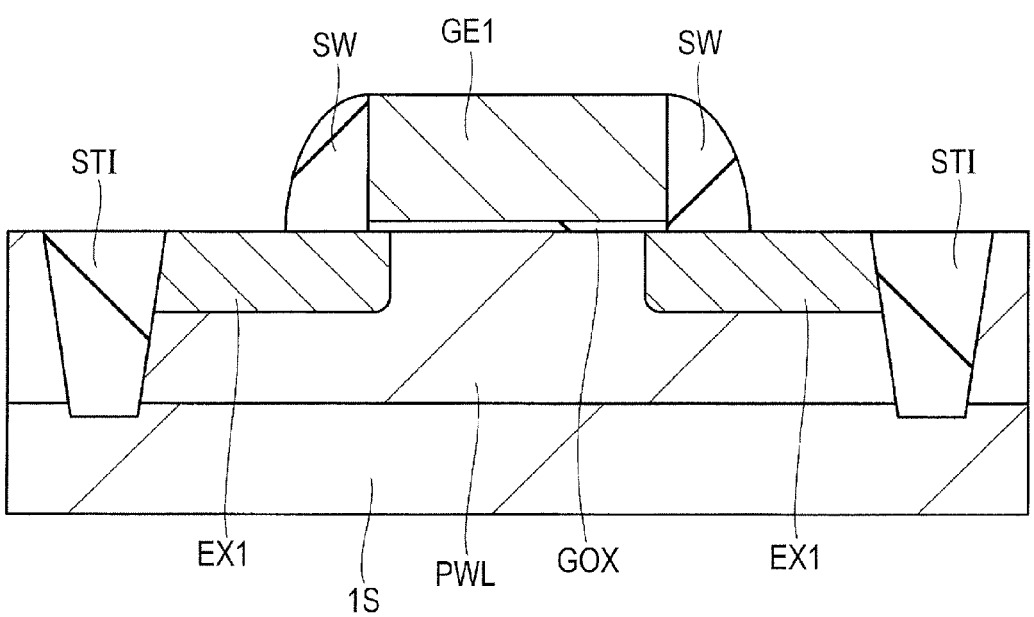
FIG. 19 is a sectional view showing a manufacturing step of the semiconductor device following FIG. 18.

Successively, as shown in FIG. 19, a silicon oxide film is formed over the semiconductor substrate 1S. The silicon oxide film can be formed for example by the CVD method. Then, by anisotropically etching the silicon oxide film, sidewall spacers SW are formed over sidewalls on both the sides of the gate electrode GE1. Each of the sidewall spacers SW comprises for example a single-layered film of a silicon oxide film, but is not limited to it, and may also comprise a silicon nitride film or a silicon oxynitride film. Otherwise, the sidewall spacer SW may comprise a laminated film formed by combining some of a silicon nitride film, a silicon oxide film, and a silicon oxynitride film.

Figure 20:
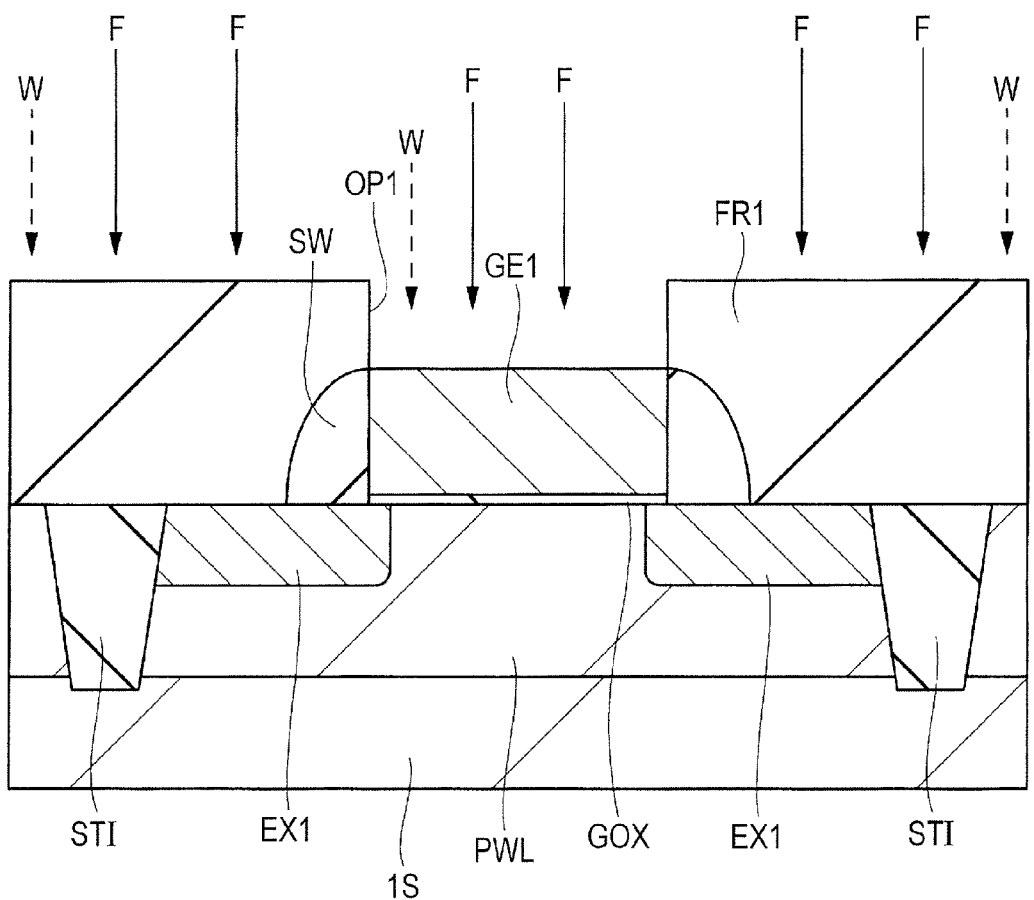
FIG. 20 is a sectional view showing a manufacturing step of the semiconductor device following FIG. 19.

Successively, as shown in FIG. 20, after a resist film FR1 is formed over the semiconductor substrate 1S over which the gate electrode GE1 is formed, the resist film FR1 is patterned by the photolithography technology. The patterning of the resist film FR1 is carried out so as to form an opening OP1 opening above the gate electrode GE1 as shown in FIG. 20. More specifically, the patterning is carried out in the manner of opening the region AR shown in FIG. 9. That is, the patterning of the resist film FR1 is carried out so as to open a part planarly overlapping with a channel region in the gate electrode GE1.

Then, as shown in FIG. 20, fluorine is injected into the interior of the gate electrode GE1 exposed from the opening OP1 by the ion implantation method using the resist film FR1 in which the opening OP1 is formed as a mask. The fluorine implantation conditions on this occasion for example are that the injection energy is 3 to 50 keV and the dose quantity is $1\times10^{14}/cm^2$ to $1\times10^{16}/cm^2$. Thus according to Embodiment 1, it is possible to inject fluorine into the part planarly overlapping with the channel region in the gate electrode GE1 of the amplification transistor.

Meanwhile, in Embodiment 1, as shown in FIG. 20, the region other than the opening OP1 is covered with the resist film FR1. As a result, fluorine is not injected into the interior of the semiconductor substrate 1S covered with the resist film FR1. When fluorine is injected by the ion implantation method in particular, for example tungsten is included as a pollutant but the fluorine and the tungsten are not injected into the interior of the semiconductor substrate 1S covered with the resist film FR1. Further, it is concerned that the tungsten is injected also into the gate electrode GE1 through the opening OP1 but it is estimated that the tungsten injected into the gate electrode GE1 does not diffuse up to the interior of the semiconductor substrate 1S. From this, according to Embodiment 1, it is estimated that fluorine and tungsten are not injected up to the interior of the semiconductor substrate 1S. As a result, according to Embodiment 1, since fluorine is not introduced into the interior of the semiconductor substrate 1S, it is possible to inhibit the increase of the number of white spots at dark and the increase of a dark current caused by the tungsten intruding when fluorine is introduced.

Here, as shown in FIG. 20, in the case of forming the width of the opening OP1 so as to be identical to the width (width in the gate length direction) of the gate electrode GE1, the quantity of fluorine effectively injected into the gate electrode GE1 may vary undesirably by the misregistration of the opening OP1 caused by the misfit of a mask. Even in this case however, it is estimated that the 1/f noise characteristic of an amplification transistor contained in each of plural pixels originally varies largely and some change of the quantity of injected fluorine caused by the misregistration of the opening OP1 does not become obvious as a problem. Further, in order to reduce the influence of the change of the quantity of injected fluorine caused by the misregistration of the opening OP1, for example a means for reducing the width of the opening OP1 to the extent of an estimated misregistration beforehand so as to be smaller than the width of the gate electrode GE1 can be adopted as a countermeasure.

Figure 21:
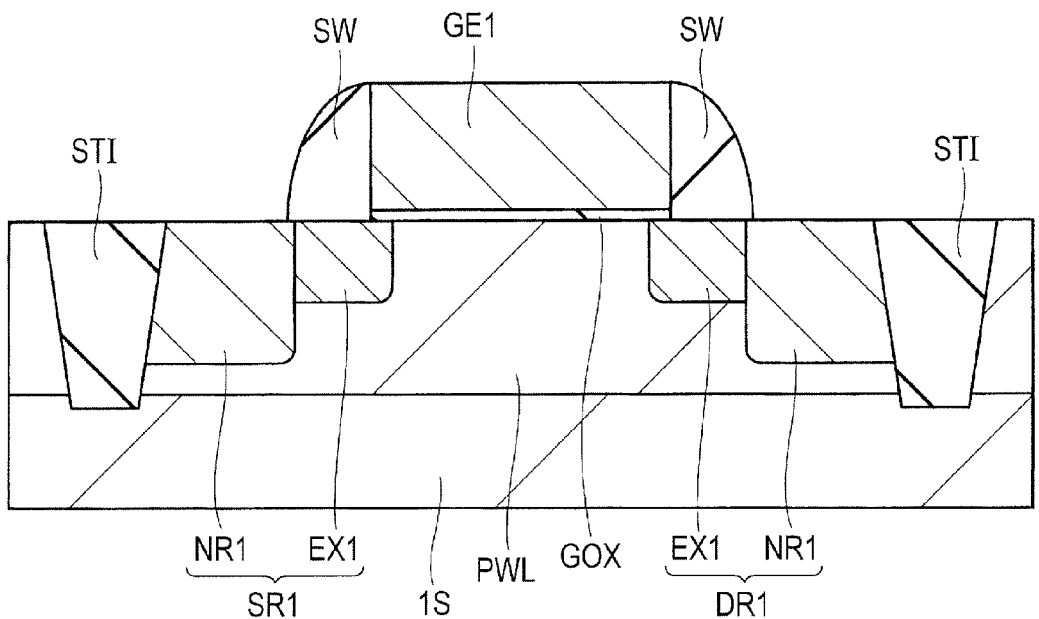
FIG. 21 is a sectional view showing a manufacturing step of the semiconductor device following FIG. 20.

Successively, after the resist film FR1 is removed, as shown in FIG. 21, a deep high concentration impurity diffusion region NR1 matching the sidewall spacers SW is formed by the photolithography technology and the ion implantation method. The deep high concentration impurity diffusion region NR1 is an n-type semiconductor region. A source region SR1 comprises the deep high concentration impurity diffusion region NR1 and the shallow low concentration impurity diffusion region EX1. Likewise, a drain region DR1 comprises the deep high concentration impurity diffusion region NR1 and the shallow low concentration impurity diffusion region EX1. In this way, by forming the source region SR1 and the drain region DR1 with the shallow low concentration impurity diffusion region EX1 and the deep high concentration impurity diffusion region NR1, the source region SR1 and the drain region DR1 can be an LDD (Lightly Doped Drain) structure.

After the deep high concentration impurity diffusion region NR1 is formed in this way, heat treatment of about 1,000° C. is applied to the semiconductor substrate 1S. Thus the activation of the introduced impurity is carried out. By the heat treatment on this occasion, fluorine injected into the gate electrode GE1 also diffuses and reaches the gate insulation film GOX. In this way, according to Embodiment 1, the heat treatment to carry out the activation of the conductive type impurity introduced into the source region SR1 and the drain region DR1 also plays the role of the heat treatment to diffuse the fluorine injected into the gate electrode GE1 into the gate insulation film GOX. As a result, according to Embodiment 1, it is possible to combine a dangling bond existing in the gate insulation film GOX with the fluorine injected into the gate electrode GE1 by the heat treatment. That is, according to Embodiment 1, it is possible to reduce the dangling bond existing in the gate insulation film GOX. As a result, according to Embodiment 1, it is possible to reduce the 1/f noise of the amplification transistor and finally reduce the baseline noise of the image sensor.

From the above results, according to Embodiment 1, by introducing fluorine into the part overlapping with the channel region in the gate electrode GE1 and not introducing fluorine into the interior of the semiconductor substrate 1S, it is possible to attain both the reduction of the baseline noise of the image sensor and the inhibition of the increase of the number of white spots at dark and a dark current.

Figure 22:
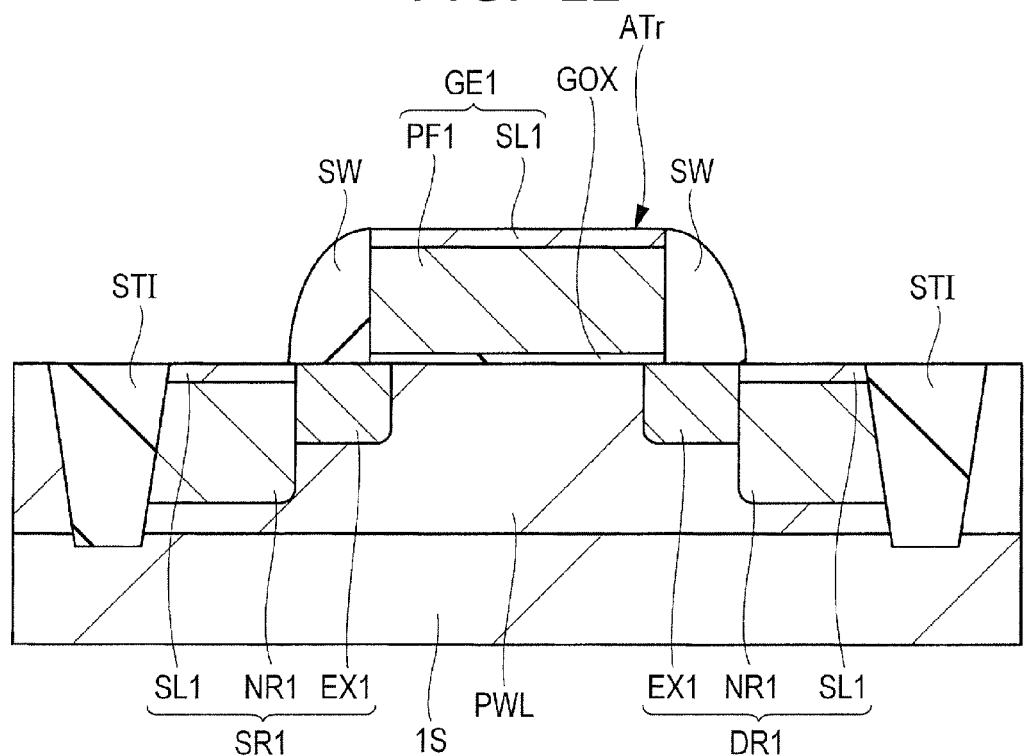
FIG. 22 is a sectional view showing a manufacturing step of the semiconductor device following FIG. 21.

Successively, as shown in FIG. 22, a cobalt film is formed over the semiconductor substrate 1S. On this occasion, the cobalt film is formed so as to directly touch the gate electrode GE1. Likewise, the cobalt film also directly touches the deep high concentration impurity diffusion region NR1. The cobalt film can be formed for example by a sputtering method. Then, after the cobalt film is formed, by applying heat treatment to the semiconductor substrate 1S, the polysilicon film PF1 configuring the gate electrode GE1 and the cobalt film react and a silicide film SL1 comprising a cobalt silicide film is formed. Thus the gate electrode GE1 comes to be a laminated structure comprising the polysilicon film PF1 and the silicide film SL1. The silicide film SL1 is formed for reducing the resistance of the gate electrode GE1. Likewise, by the heat treatment, over the surface of the deep high concentration impurity diffusion region NR1 too, silicon and a cobalt film react and a silicide film SL1 comprising a cobalt silicide film is formed. Consequently, the reduction of resistance is attained also in the source region SR1 and the drain region DR1. Then an unreacted cobalt film is removed from over the semiconductor substrate 1S.

Here, although the silicide film SL1 comprising the cobalt silicide film is formed in Embodiment 1, it is also possible to form the silicide film SL1 for example from, in place of a cobalt silicide film, a nickel silicide film, a titanium silicide film, or a platinum silicide film.

Figure 23:
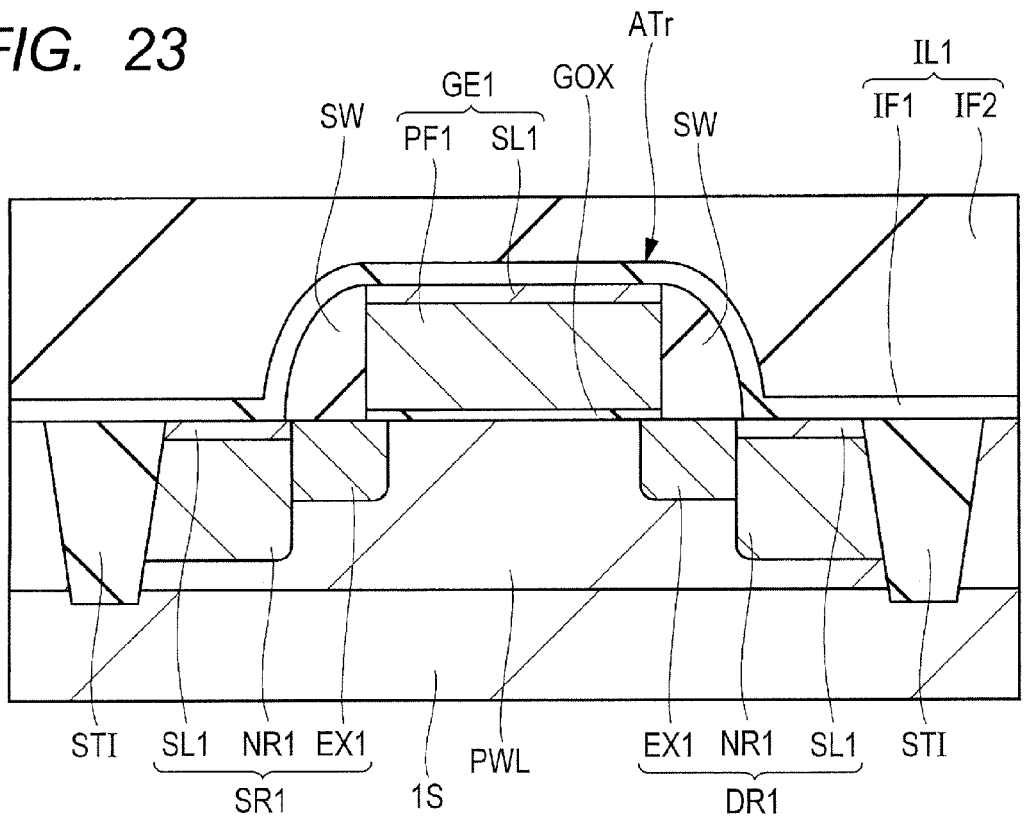
FIG. 23 is a sectional view showing a manufacturing step of the semiconductor device following FIG. 22.

In this way, the amplification transistor ATr according to Embodiment 1 can be manufactured. Successively, as shown in FIG. 23, an insulation film IF1 comprising for example a silicon nitride film is formed over the semiconductor substrate 1S over which the amplification transistor ATr is formed and an insulation film IF2 comprising for example a silicon oxide film is formed over the insulation film IF1. Thus an interlayer insulation film IL1 comprising the insulation film IF1 and the insulation film IF2 can be formed.

Figure 24:
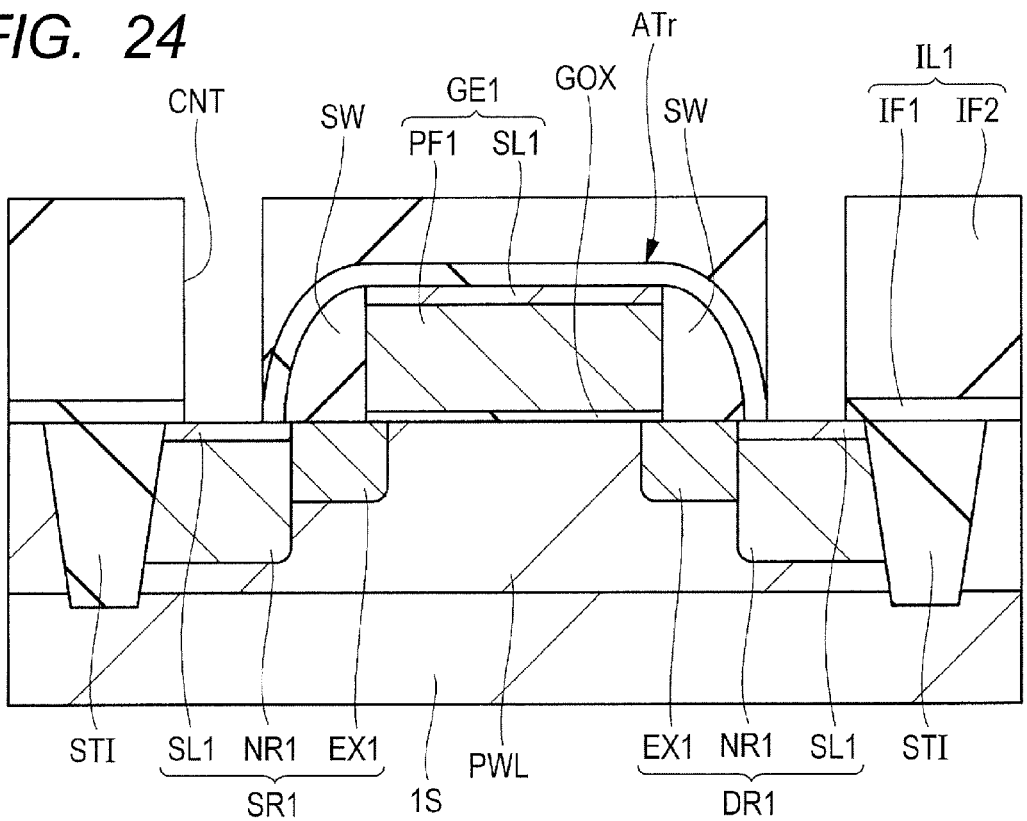
FIG. 24 is a sectional view showing a manufacturing step of the semiconductor device following FIG. 23.

Successively, as shown in FIG. 24, contact holes CNT passing through the interlayer insulation film IL1 and reaching the source region SR1 and the drain region DR1 are formed by the photolithography technology and the etching technology.

Figure 25:
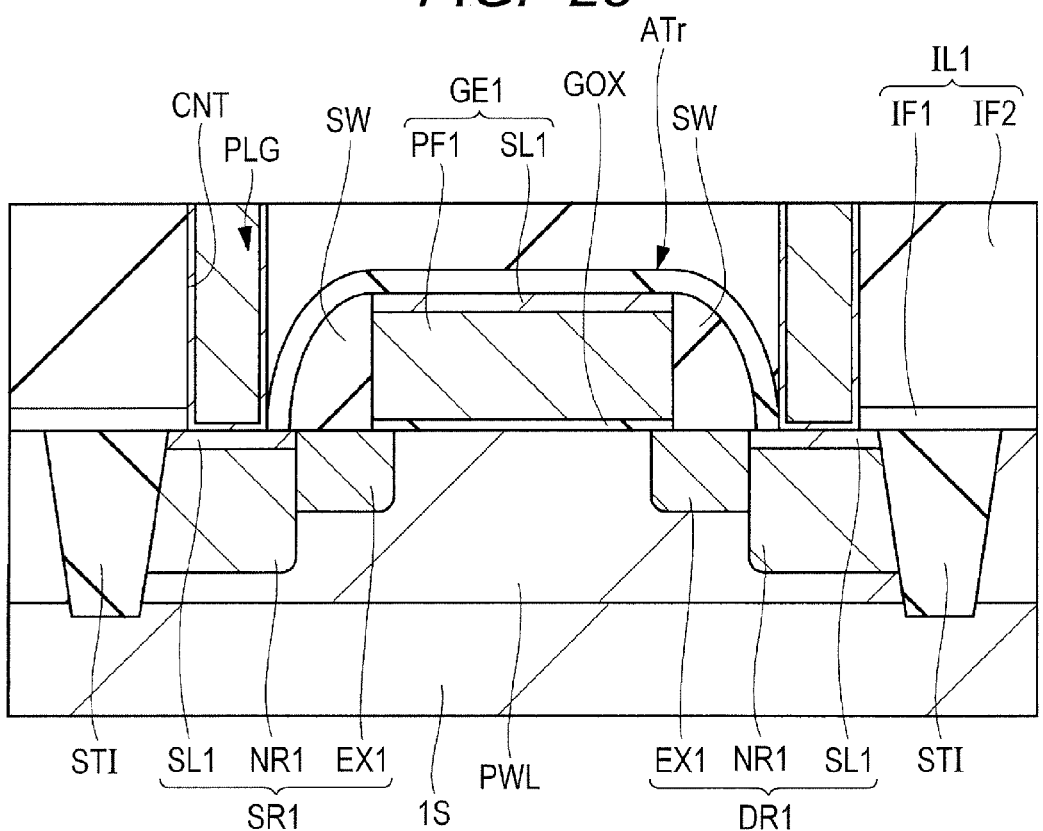
FIG. 25 is a sectional view showing a manufacturing step of the semiconductor device following FIG. 24.

Successively, as shown in FIG. 25, a titanium/titanium nitride film is formed over the interlayer insulation film IL1 including the bottom face and the inner wall of each of the contact holes CNT. The titanium/titanium nitride film comprises a laminated film of a titanium film and a titanium nitride film and can be formed for example by the sputtering method. The titanium/titanium nitride film has a so-called barrier property to prevent tungsten that is the material of the film embedded in the contact hole CNT from diffusing into silicon at a succeeding step for example.

Successively, a tungsten film is formed over the whole principal face of the semiconductor substrate 1S in the manner of being embedded in the contact holes CNT. The tungsten film can be formed for example by the CVD method. Then plugs PLG are formed by removing the unnecessary titanium/titanium nitride film and tungsten film formed over the interlayer insulation film IL1 for example by the CMP method.

Successively, as shown in FIG. 10, an interlayer insulation film IL2 comprising a thin silicon carbonitride film and a thick silicon oxide film is formed over the interlayer insulation film IL1 and the plugs PLG. Successively, the interlayer insulation film IL2 is patterned and the silicon oxide film is etched by using the silicon carbonitride film as an etching stopper by the photolithography technology and the etching technology. Successively, by etching the silicon carbonitride film, wiring trenches are formed in the interlayer insulation film IL2.

Successively, a barrier metal film comprising tantalum nitride or tantalum is formed in the wiring trenches and a conductive film containing copper as the main component is formed over the barrier metal film by a plating method or the like. Successively, by removing the copper film and the barrier metal film outside the wiring trenches by the CMP method or the like, wires L1 embedded in the interlayer insulation film IL2 are completed. Successively, a multilayered wire is formed over the wires L1 but the explanations are omitted here. In this way, the semiconductor device configuring a part of the image sensor according to Embodiment 1 can be manufactured.

<Modified Example>

In Embodiment 1, the explanations have been made on the basis of the case of injecting fluorine into the part planarly overlapping with the channel region in the gate electrode GE1 before forming the deep high concentration impurity diffusion region NR1 configuring a part of the source region SR1 or the drain region DR1. The technological thought in Embodiment 1 however is not limited to the case and, as shown in the modified example for example, it is also possible to inject fluorine into the part planarly overlapping with the channel region in the gate electrode GE1 after forming the deep high concentration impurity diffusion region NR1 configuring a part of the source region SR1 or the drain region DR1. The steps are explained hereunder.

Figure 26:
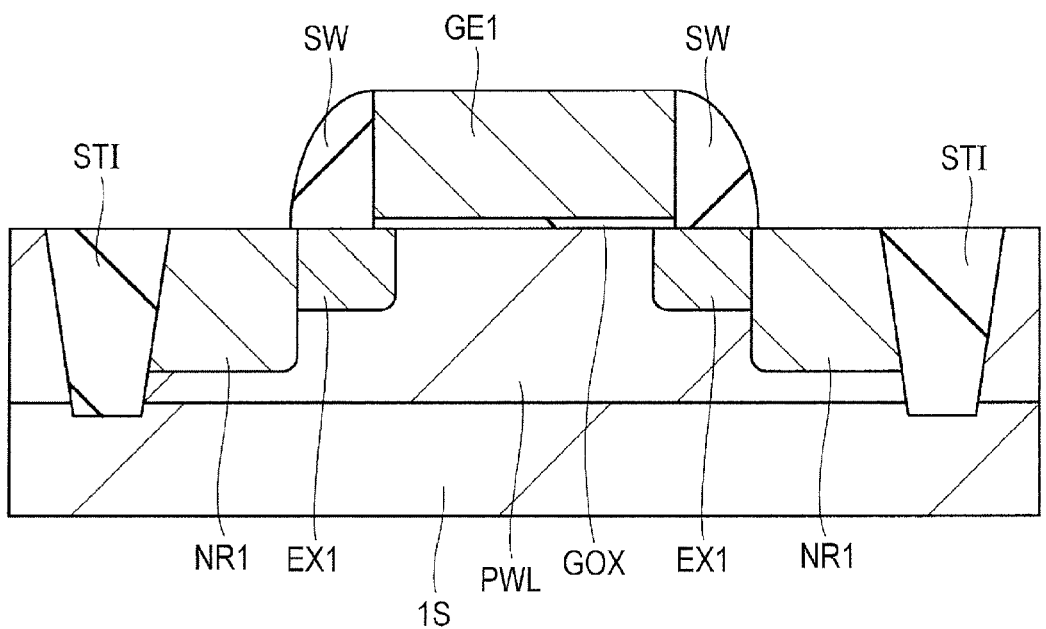
FIG. 26 is a sectional view showing a manufacturing step of a semiconductor device according to a modified example.

After the steps shown in FIGS. 14 to 19, as shown in FIG. 26, a deep high concentration impurity diffusion region NR1 matching the sidewall spacers SW is formed by the photolithography technology and the ion implantation method.

Figure 27:
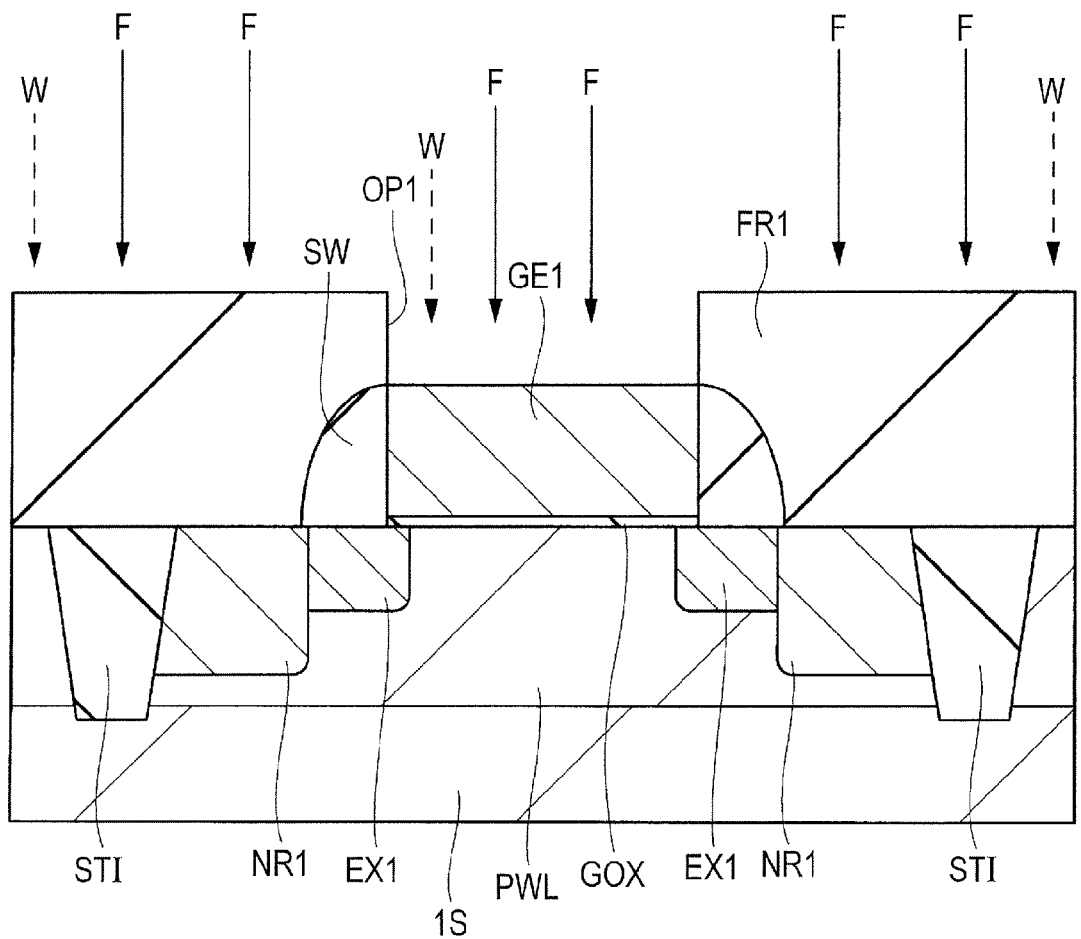
FIG. 27 is a sectional view showing a manufacturing step of the semiconductor device following FIG. 26.

Successively, as shown in FIG. 27, after a resist film FR1 is formed over the semiconductor substrate 1S over which the gate electrode GE1 is formed, the resist film FR1 is patterned by the photolithography technology. The resist film FR1 is patterned so as to form the opening OP1 opening at the part planarly overlapping with the channel region in the gate electrode GE1.

Then fluorine is injected into the interior of the gate electrode GE1 exposed from the opening OP1 by the ion implantation method using the resist film FR1 in which the opening OP1 is formed as a mask. The fluorine implantation conditions on this occasion for example are that the injection energy is 3 to 50 keV and the dose quantity is $1\times10^{14}/cm^2$ to $1\times10^{16}/cm^2$. Thus according to the modified example too, it is possible to inject fluorine into the part planarly overlapping with the channel region in the gate electrode GE1 of the amplification transistor. Meanwhile, in the modified example too, the region other than the opening OP1 is covered with the resist film FR1. As a result, fluorine and tungsten (pollutant) are not injected into the interior of the semiconductor substrate 1S covered with the resist film FR1.

Successively, heat treatment of about 1,000° C. is applied to the semiconductor substrate 1S. Thus the impurity introduced into the source region SR1 and the drain region DR1 is activated. By the heat treatment on this occasion, the fluorine injected into the gate electrode GE1 also diffuses and reaches the gate insulation film GOX. In this way, in the modified example too, the heat treatment to carry out the activation of the conductive type impurity introduced into the source region SR1 and the drain region DR1 also plays the role of the heat treatment to diffuse the fluorine injected into the gate electrode GE1 into the gate insulation film GOX.

From the above results, in the modified example too, by introducing fluorine into the part overlapping with the channel region in the gate electrode GE and not introducing fluorine into the interior of the semiconductor substrate 1S, it is possible to attain both the reduction of the baseline noise of the image sensor and the inhibition of the increase of the number of white spots at dark and a dark current.

In Embodiment 1 and the modified example stated above, fluorine is injected into the part planarly overlapping with the channel region in the gate electrode GE1 at a step immediately before the heat treatment to activate the impurity introduced into the source region SR1 and the drain region DR1. On this occasion, as explained at the paragraph of <difference in effect of insertion timing of fluorine implantation step>, the effect of reducing the noise power of the amplification transistor is the maximum.

The technological thought according to Embodiment 1 however is not limited to the case and it is also possible to inject fluorine into the part planarly overlapping with the channel region in the gate electrode GE1 at the insertion timing shown at the fluorine implantation step 1 or the fluorine implantation step 2 shown in FIG. 12. On this occasion, although the effect of reducing the noise power of the amplification transistor is not the maximum, even with the configuration, it is possible to increase the effect of reducing the noise power of the amplification transistor by introducing additional high temperature heat treatment immediately after the insertion timing shown at the fluorine implantation step 1 or the fluorine implantation step 2. That is, for the effect of reducing the noise power of the amplification transistor, it is useful to adopt the configuration of injecting fluorine into the part planarly overlapping with the channel region in the gate electrode GE1 at the step immediately before the high temperature heat treatment. From this viewpoint, it is possible to increase the effect of reducing the noise power of the amplification transistor by introducing additional high temperature heat treatment immediately after the insertion timing shown at the fluorine implantation step 1 or the fluorine implantation step 2 shown in FIG. 12.

(Embodiment 2)

In Embodiment 2, the case of injecting fluorine into a part planarly overlapping with a channel region in a gate electrode after an interlayer insulation film is formed is explained.

Figure 28:
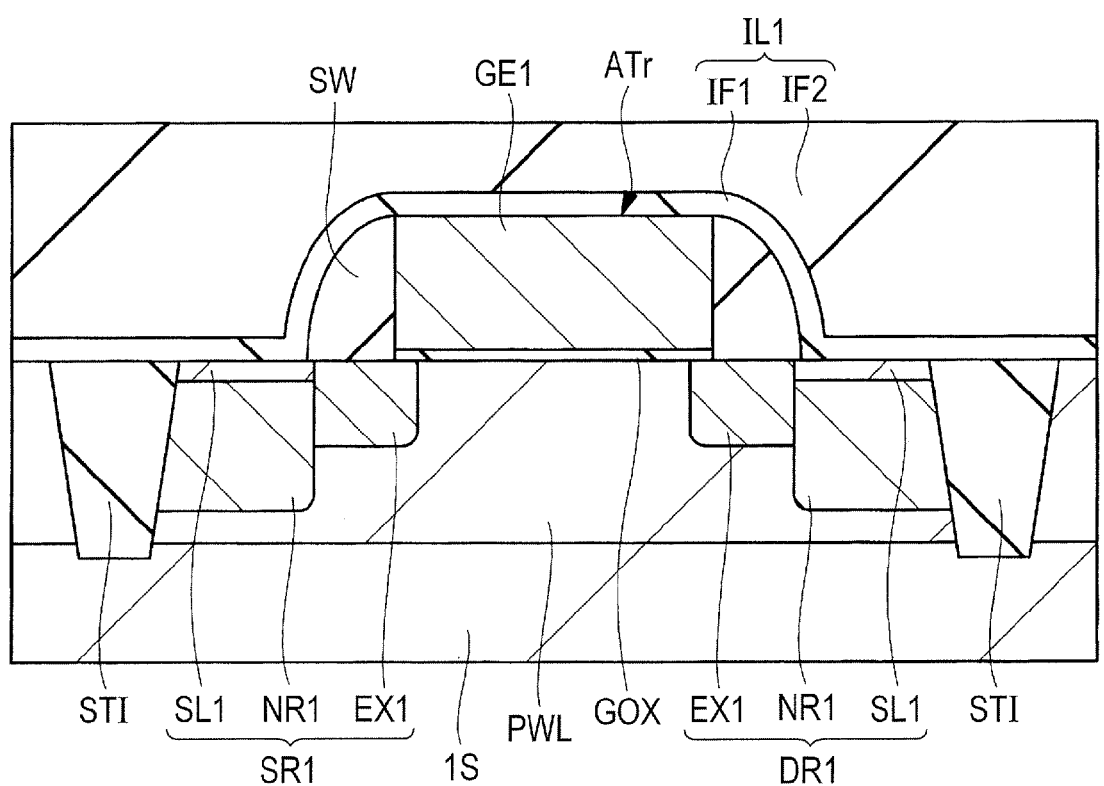
FIG. 28 is a sectional view showing a manufacturing step of a semiconductor device according to Embodiment 2.

Firstly, without inserting a fluorine implantation step, an amplification transistor is formed over a semiconductor substrate on the basis of the flowchart shown in FIG. 12. Successively, as shown in FIG. 28, over the semiconductor substrate 1S over which the amplification transistor ATr is formed, an insulation film IF1 comprising a silicon nitride film and an insulation film IF2 comprising a silicon oxide film formed over the insulation film IF1 are formed for example by the CVD method. Thus an interlayer insulation film IL1 comprising the insulation film IF1 and the insulation film IF2 can be formed.

Here, as shown in FIG. 28, in the amplification transistor ATr according to Embodiment 2, the silicide film SL1 comprising for example a cobalt silicide film is formed at the source region SR1 and the drain region DR1 but the silicide film SL1 is not formed at the gate electrode GE1. The purpose is to make it difficult to inject fluorine by the silicide film SL1 when the fluorine is injected into the part planarly overlapping with the channel region in the gate electrode GE1 at a succeeding step. In Embodiment 2 therefore, it is desirable not to form the silicide film SL1 over the whole gate electrode GE1 but not to form the silicide film SL1 only at the part planarly overlapping with the channel region in the gate electrode GE1. The reason is that, by forming the silicide film SL1 at the part other than the gate electrode GE1, it is possible to reduce the resistance of the gate electrode GE1 and also to reduce the contact resistance between the gate electrode GE1 and a plug coupled to the gate electrode GE1.

Figure 29:
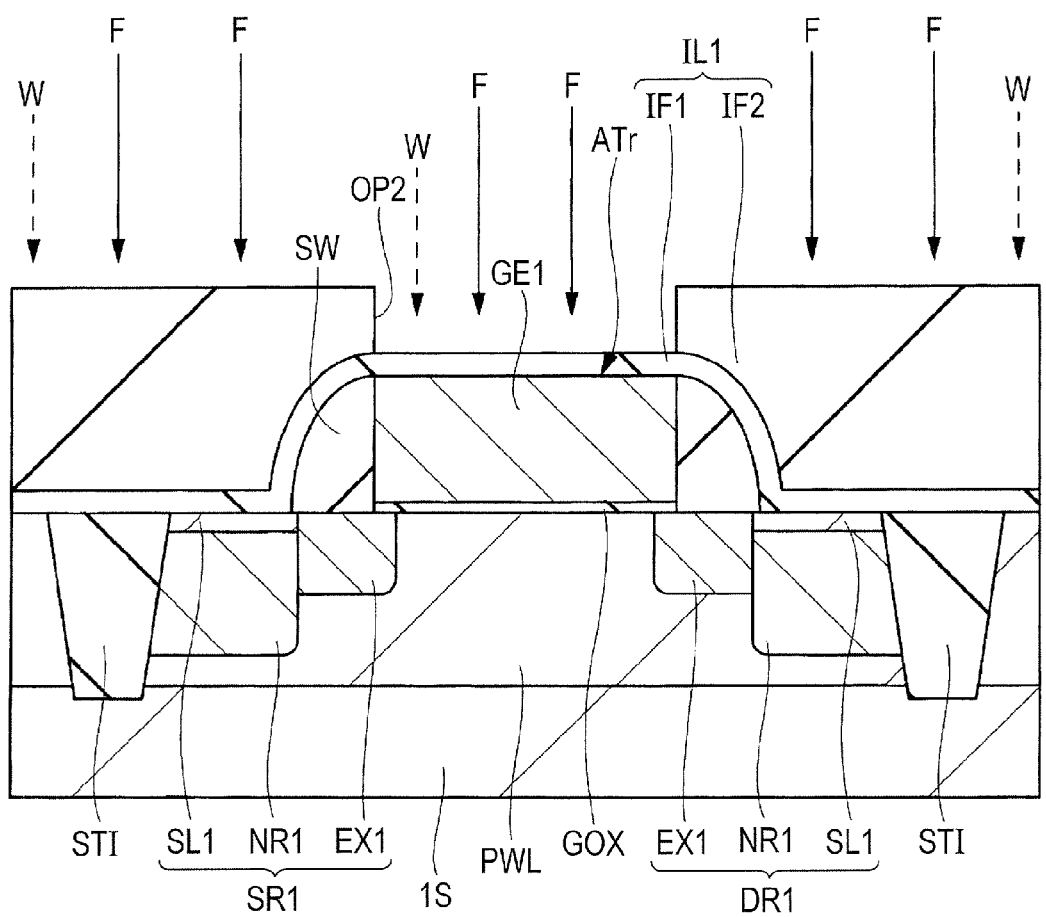
FIG. 29 is a sectional view showing a manufacturing step of the semiconductor device following FIG. 28.

Successively, as shown in FIG. 29, in plan view, the insulation film IF2 formed over the part overlapping with the channel region in the gate electrode GE1 is removed and the interlayer insulation film IL1 is patterned so as to expose the insulation film IF1 by the photolithography technology and the etching technology. That is, as shown in FIG. 29, an opening OP2 at the bottom face of which the insulation film IF1 is exposed is formed over the part overlapping with the channel region in the gate electrode GE1.

Successively, fluorine is introduced into the part overlapping with the channel region in the gate electrode GE1 by using the patterned interlayer insulation film IL1 as a mask. In Embodiment 2 however, the region other than the opening OP2 is covered with the interlayer insulation film IL1. As a result, fluorine and tungsten (pollutant) are not injected into the interior of the semiconductor substrate 1S covered with the interlayer insulation film IL1. When fluorine is injected by the ion implantation method in particular, for example tungsten is included as a pollutant but the fluorine and the tungsten are not injected into the interior of the semiconductor substrate 1S covered with the interlayer insulation film IL1. Further, it is concerned that the tungsten is injected also into the gate electrode GE1 through the opening OP2 but it is estimated that the tungsten injected into the gate electrode GE1 does not diffuse up to the interior of the semiconductor substrate 1S. From this, according to Embodiment 2, it is estimated that fluorine and tungsten are not injected up to the interior of the semiconductor substrate 1S. As a result, according to Embodiment 2, since fluorine is not introduced into the interior of the semiconductor substrate 1S, it is possible to inhibit the increase of the number of white spots at dark and the increase of a dark current caused by the tungsten intruding when fluorine is introduced.

Successively, heat treatment of for example about 650° C. is applied to the semiconductor substrate 1S. Thus the fluorine injected into the gate electrode GE1 diffuses and reaches the gate insulation film GOX. As a result, according to Embodiment 2, it is possible to combine a dangling bond existing in the gate insulation film GOX with the fluorine injected into the gate electrode GE1 by the heat treatment. That is, according to Embodiment 2, it is possible to reduce the dangling bond existing in the gate insulation film GOX. Thus according to Embodiment 2, it is possible to: reduce the 1/f noise of the amplification transistor; and finally reduce the baseline noise of the image sensor.

From this, according to Embodiment 2 too, by introducing fluorine into the part overlapping with the channel region in the gate electrode GE1 and not introducing fluorine into the interior of the semiconductor substrate 1S, it is possible to attain both the reduction of the baseline noise of the image sensor and the inhibition of the increase of the number of white spots at dark and a dark current.

Figure 30:
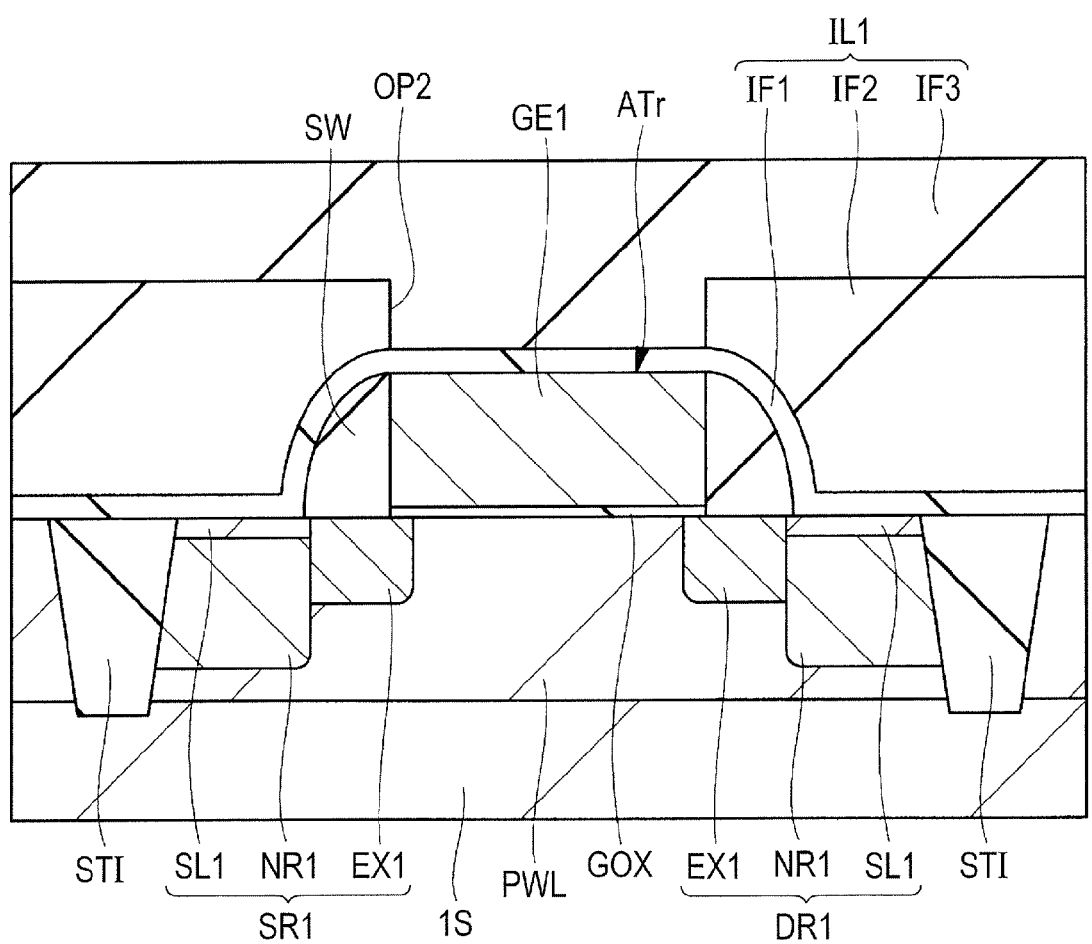
FIG. 30 is a sectional view showing a manufacturing step of the semiconductor device following FIG. 29.

Successively, as shown in FIG. 30, an insulation film IF3 comprising a silicon oxide film is formed over the insulation film IF2 in which the opening OP2 is formed for example by the CVD method. Thus the insulation film IF3 is embedded in the opening OP2 formed in the insulation film IF2. Then the surface of the insulation film IF3 is flattened for example by the CMP method.

The succeeding steps are the same as Embodiment 1. In this way, it is possible to manufacture a semiconductor device configuring a part of an image sensor according to Embodiment 2.

Here, the heat treatment carried out after fluorine is injected can also be carried out for example after the contact holes are formed in the interlayer insulation film IL1. On this occasion, the effect of being able to recover an etching damage caused when the contact holes are formed by the heat treatment is also obtained.

Further, according to Embodiment 2, as shown in FIG. 29, fluorine and tungsten (pollutant) are prevented from being injected into the interior of the semiconductor substrate 1S by the interlayer insulation film IL1. In this way, according to Embodiment 2, fluorine is introduced into the interlayer insulation film IL1 and the following advantages are obtained by introducing the fluorine into the interlayer insulation film IL1. That is, a part of the interlayer insulation film IL1 comprises the insulation film IF2 comprising a silicon oxide film. On this occasion, when fluorine is introduced into the silicon oxide film, an SiOF film is formed and the permittivity of the SiOF film is lower than that of the silicon oxide film. That is, according to Embodiment 2, the interlayer insulation film IL1 comprises a low permittivity film called the SiOF film. As a result, according to Embodiment 2, the effect of being able to reduce a parasitic capacity can also be obtained.

<Modified Example 1>

Figure 31:
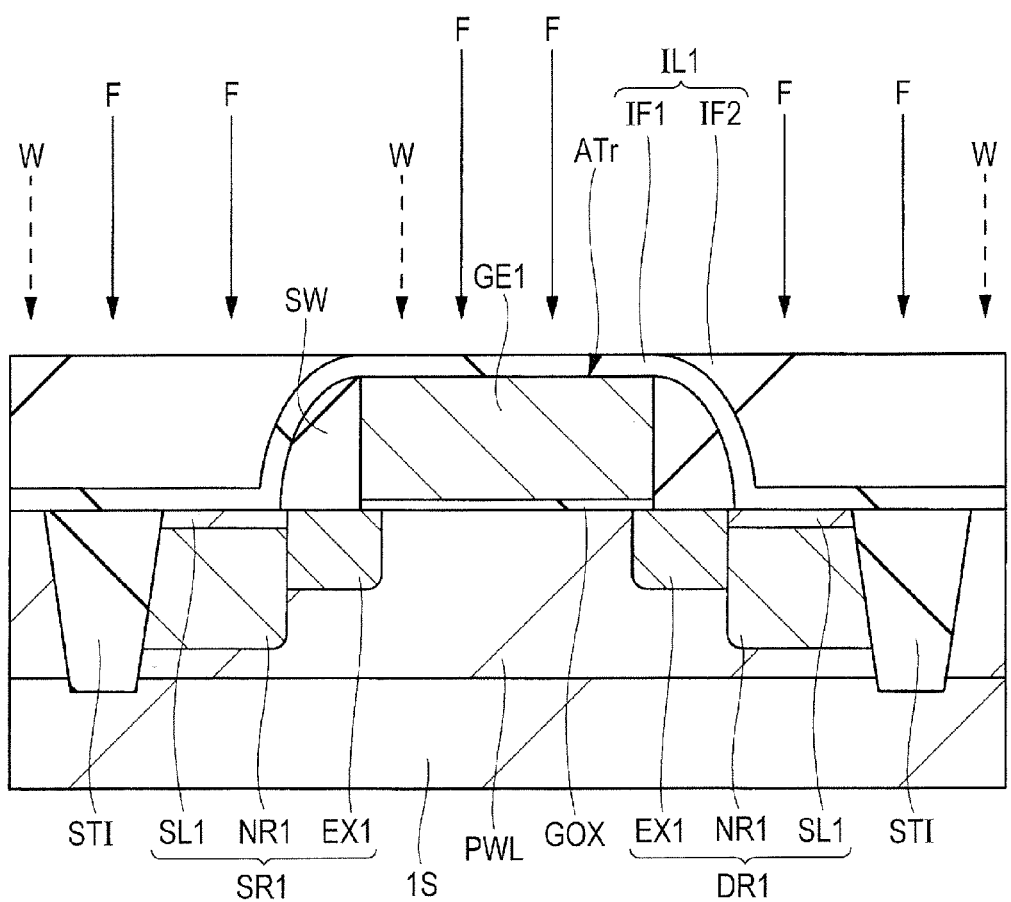
FIG. 31 is a sectional view showing a manufacturing step of a semiconductor device according to Modified Example 1.

In Embodiment 2, the explanations have been made on the basis of the case of forming the opening OP2 in the interlayer insulation film IL1 by etching the insulation film IF2 configuring a part of the interlayer insulation film IL1 as shown in FIG. 29 for example. In contrast, as shown in FIG. 31 for example, it is also possible to adopt the configuration of exposing the insulation film IF1 over the part overlapping with the channel region in the gate electrode GE1 by polishing the surface of the interlayer insulation film IL1 by the CMP method.

In Modified Example 1 configured in this way, since the insulation film IF1 is exposed over the whole gate electrode GE1, the part other than the part overlapping with the channel region in the gate electrode GE1 is covered for example with a resist film and successively fluorine is injected into the overlapping region. In Modified Example 1 configured in this way too, the effect similar to Embodiment 2 can be obtained. Here, as it is obvious by comparing FIG. 29 with FIG. 31, the thickness of the interlayer insulation film IL1 is small in Modified Example 1. As a result, from the viewpoint of not injecting fluorine and tungsten (pollutant) into the interior of the semiconductor substrate 1S to the greatest possible extent, it can be said that Embodiment 2 of injecting fluorine in the state where the thickness of the interlayer insulation film IL1 is heavy is more desirable.

<Modified Example 2>

Figure 32:
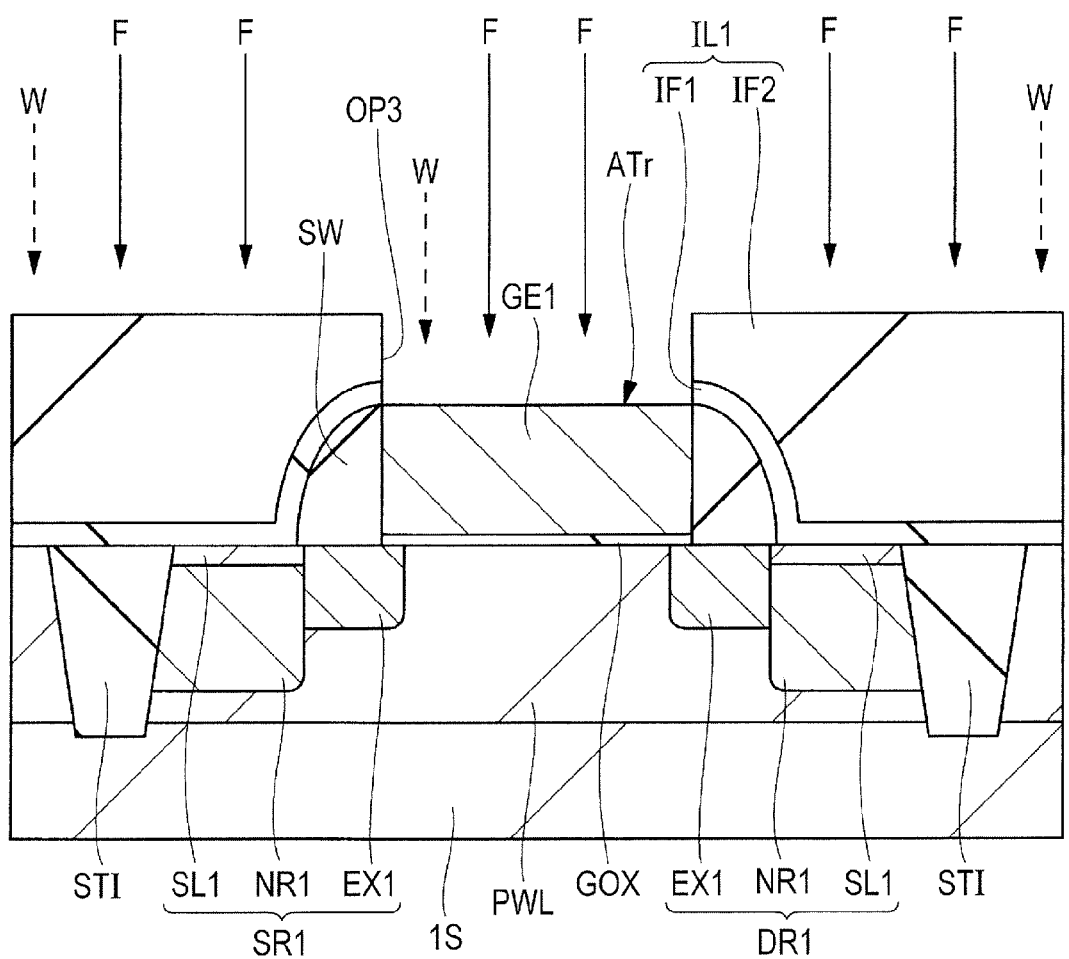
FIG. 32 is a sectional view showing a manufacturing step of a semiconductor device according to Modified Example 2.

In Embodiment 2, the explanations have been made on the basis of the case of forming the opening OP2 so as to expose the insulation film IF1 from the bottom face of the opening OP2 as shown in FIG. 29 for example. In contrast, as shown in FIG. 32 for example, it is also possible to pattern the interlayer insulation film IL1 so as to remove the insulation film IF2 and the insulation film IF1 formed over the part in plan view overlapping with the channel region in the gate electrode GE1 and expose the gate electrode GE1 over the overlapping part by the photolithography technology and the etching technology. That is, as shown in FIG. 32, it is possible to form an opening OP3 exposing the top face of the part overlapping with the channel region in the gate electrode GE1. On this occasion too, fluorine is introduced into the part overlapping with the channel region in the gate electrode GE1 by using the patterned interlayer insulation film IL1 as a mask. Meanwhile, in Modified Example 2 too, the region other than the opening OP3 is covered with the interlayer insulation film IL1. As a result, fluorine and tungsten (pollutant) are not injected into the interior of the semiconductor substrate 1S covered with the interlayer insulation film IL1. Thus in Modified Example 2 too, the effect similar to Embodiment 2 can be obtained.

Here, as an advantage of the modified example, since the part overlapping with the channel region in the gate electrode GE1 is exposed, it is possible to for example: form a cobalt film so as to directly touch the overlapping part after fluorine is injected into the overlapping part; and successively apply heat treatment for a siliciding step. Thus according to Modified Example 2, it is possible to form a silicide film also at the part overlapping with the channel region in the gate electrode GE1. Thus according to Modified Example 2, it is possible to reduce the resistance of the gate electrode GE1 further than Embodiment 2. According to Modified Example 2 in particular, it is also possible to diffuse the fluorine injected into the gate electrode GE1 into the gate insulation film GOX by the heat treatment for the siliciding step.

(Embodiment 3)

In Embodiment 1, the explanations have been made on the basis of the configuration example of, in the amplification transistor that is a constituent component of a pixel, introducing fluorine into the part overlapping with the channel region in the gate electrode and not introducing fluorine into the interior of the semiconductor substrate. In Embodiment 3 further, explanations will be made on the basis of the configuration example of, in a p-channel field-effect transistor configuring a peripheral circuit too, introducing fluorine into a part overlapping with a channel region in a gate electrode and not introducing fluorine into the interior of a semiconductor substrate.

Figure 33:
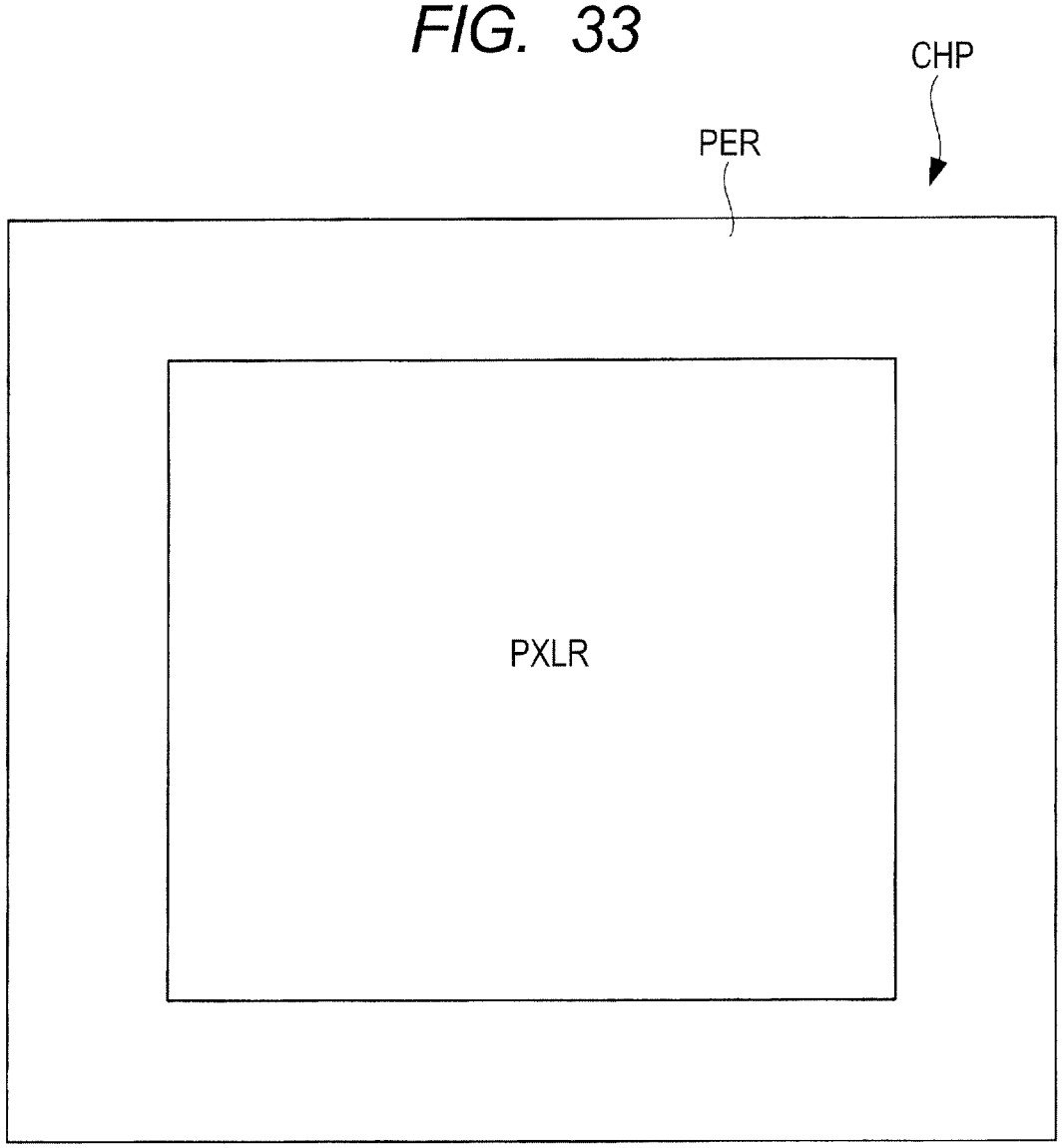
FIG. 33 is a plan view showing a schematic configuration of a semiconductor chip in which an image sensor is formed according to Embodiment 3.

FIG. 33 is a plan view showing a schematic configuration of a semiconductor chip CHP in which an image sensor is formed according to Embodiment 3. As shown in FIG. 33, in the semiconductor chip CHP according to Embodiment 3, a pixel array region PXLR where a plurality of pixels are arranged in a matrix and a peripheral circuit region PER arranged in the manner of surrounding the pixel array region PXLR exist. A peripheral circuit to control the plural pixels formed in the pixel array region PXLR is formed in the peripheral circuit region PER and for example an re-channel field-effect transistor and a p-channel field-effect transistor are included in the peripheral circuit.

Figure 34:
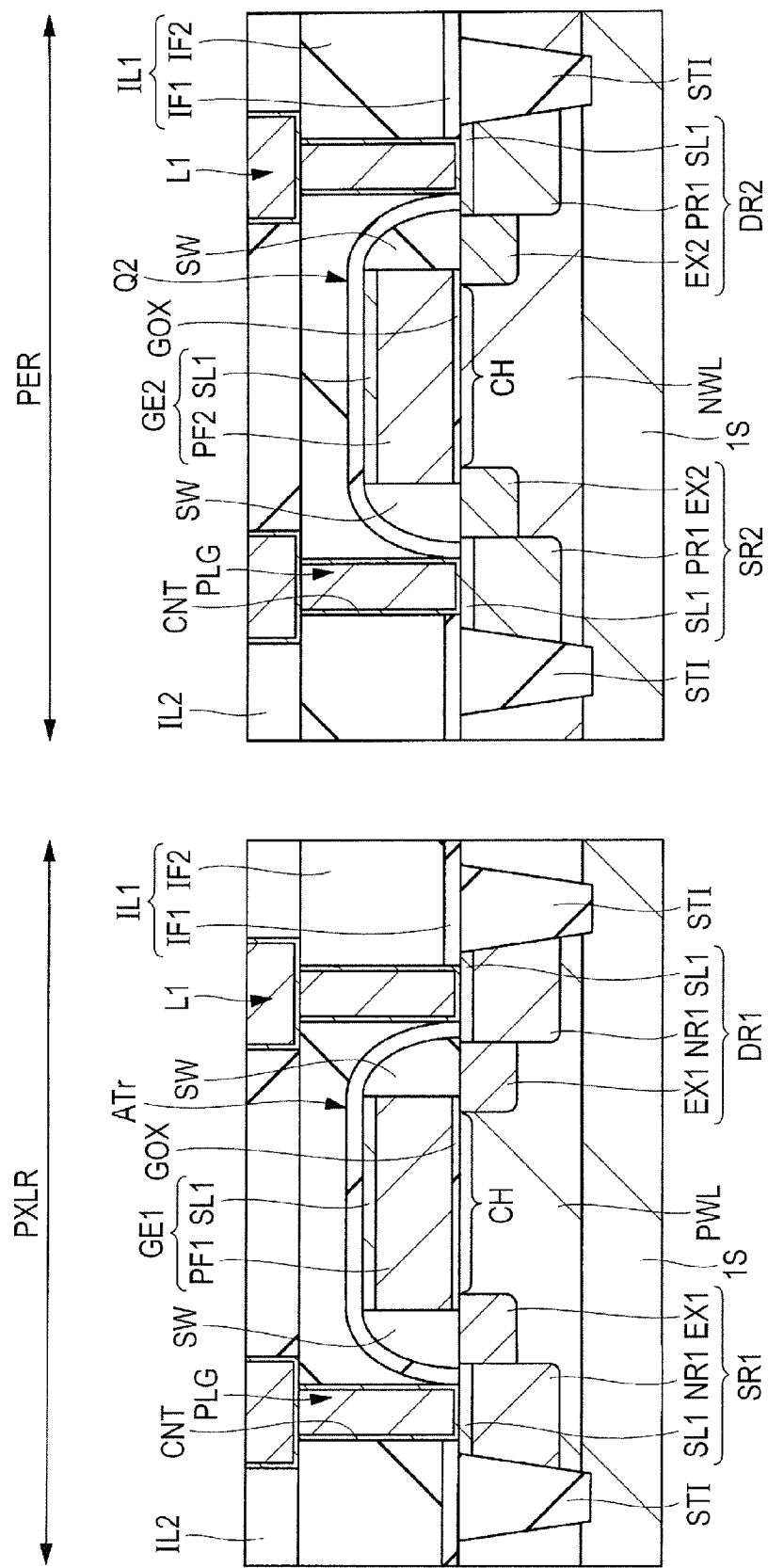
FIG. 34 is a view showing a sectional configuration of an amplification transistor formed at each of a plurality of pixels in a pixel array region shown in FIG. 33 and a sectional configuration of a p-channel field-effect transistor formed at a peripheral circuit in a peripheral circuit region shown in FIG. 33.

FIG. 34 is a view showing a sectional configuration of an amplification transistor ATr formed at each of the plural pixels in the pixel array region PXLR shown in FIG. 33 and a sectional configuration of a p-channel field-effect transistor Q2 formed at the peripheral circuit in the peripheral circuit region PER shown in FIG. 33. In FIG. 34, the cross-sectional configuration of the amplification transistor ATr is the same as Embodiment 1 (refer to FIG. 10).

Firstly the cross-sectional configuration of the p-channel field-effect transistor Q2 is explained hereunder. In FIG. 34, a plurality of element isolation regions STI are formed on the principal face side (surface side) of a semiconductor substrate 1S and an n-type well NWL that is an n-type semiconductor region is formed in an active region partitioned by the element isolation regions STI. In the n-type well NWL, a source region SR2 that is a p-type semiconductor region and a drain region DR2 that is a p-type semiconductor region are formed so as to be isolated from each other. Then a channel region CH that is an n-type semiconductor region is formed in the manner of being interposed between the source region SR2 and the drain region DR2, those being formed isolatedly.

A gate insulation film GOX comprising for example a silicon oxide film or a high permittivity film having a higher permittivity than the silicon oxide film is formed over the channel region CH and a gate electrode GE2 is formed over the gate insulation film GOX. The gate electrode GE2 comprises for example a polysilicon film PF2 and a silicide film SL1. The silicide film SL1 can comprise for example a nickel platinum silicide film, a nickel silicide film, a titanium silicide film, a cobalt silicide film, a platinum silicide film, or the like.

Sidewall spacers SW comprising for example a silicon oxide film are formed over sidewalls on both the sides of the gate electrode GE2. Then the source region SR2 comprises a low concentration impurity diffusion region EX2 formed in the manner of matching the gate electrode GE2, a high concentration impurity diffusion region PR1 formed in the manner of matching the sidewall spacers SW, and a silicide film SL1 formed over the surface of the high concentration impurity diffusion region PR1. Likewise, the drain region DR2 comprises a low concentration impurity diffusion region EX2 formed in the manner of matching the gate electrode GE2, a high concentration impurity diffusion region PR1 formed in the manner of matching the sidewall spacers SW, and a silicide film SL1 formed over the surface of the high concentration impurity diffusion region PR1.

The p-channel field-effect transistor Q2 according to Embodiment 3 is configured as stated above, an insulation film IF1 comprising for example a silicon nitride film is formed in the manner of covering the p-channel field-effect transistor Q2, and an insulation film IF2 comprising for example a silicon oxide film is formed over the insulation film IF1. An interlayer insulation film IL1 comprises the insulation film IF1 and the insulation film IF2. Then a contact hole CNT passing through the interlayer insulation film IL1 and reaching the source region SR2 or the drain region DR2 is formed in the interlayer insulation film IL1 and a plug PLG is formed in the manner of being embedded in the contact hole CNT. The plug PLG can comprise for example a titanium/titanium nitride film formed over the inner wall of the contact hole CNT and a tungsten film embedded in the contact hole CNT.

An interlayer insulation film IL2 comprising for example a silicon oxide film is formed over the interlayer insulation film IL1 in which the plug PLG is formed and a wire L1 is formed in the interlayer insulation film IL2. The wire L1 is formed so as to be electrically coupled to the plug PLG. Further, a multilayered wiring structure is formed above the wire L1 but the explanation is omitted. In this way, in the peripheral circuit region PER, the p-channel field-effect transistor Q2 is formed over the semiconductor substrate 1S and the wire L1 is formed above the p-channel field-effect transistor Q2.

Here, in Embodiment 3, attention is focused on the p-channel field-effect transistor Q2 included in the peripheral circuit formed in the peripheral circuit region PER. Then a feature point of Embodiment 3 is that, in the p-channel field-effect transistor Q2, the configuration of introducing fluorine into the part overlapping with the channel region CH in the gate electrode GE2 and not introducing fluorine into the interior of the semiconductor substrate 1S is adopted.

An advantage according to Embodiment 3 is explained hereunder. For example, it is known that a deterioration phenomenon called NBTI (Negative Bias Temperature Instability) is caused in a p-channel field-effect transistor. The "NBTI" is a phenomenon of gradually increasing the absolute value of the threshold voltage of a p-channel field-effect transistor when the temperature of a semiconductor chip rises in the state where the potential of a semiconductor substrate is negative to a gate electrode of the p-channel field-effect transistor. As a result, the deterioration phenomenon of reducing the speed of the p-channel field-effect transistor with the lapse of time is caused by the "NBTI". The "NBTI" comes to be obvious as the electric field intensity in the interior of the p-channel field-effect transistor increases in accordance with miniaturization. It is estimated that the "NBTI" is caused by the increase of an interface state and the increase of the positive charge in a gate insulation film.

Concretely, the mechanism of "NBTI" is estimated as follows. A dangling bond existing at an interface between a gate insulation film ($SiO_2$) and a semiconductor substrate (Si) is activated by hydrogen and exists as Si—H but Si—H causes electrochemical reaction and liberates hydrogen by a high temperature, the stress of a high bias, and the existence of a positive hole (hole). On this occasion, the dangling bond comes to be the interface state and the hydrogen diffuses into the gate insulation film. As a result, a part of the hydrogen dispersing in the gate insulation film is combined with a defect in the gate insulation film and forms a trap. It is estimated that the charge caused by the increase of the interface state and the trap in the gate insulation film are linked to the increase of the absolute value of the threshold voltage.

Then it is known that it is effective to combine fluorine with a dangling bond for improving "NBTI". That is, the configuration of combining fluorine with the dangling bond is, as explained in Embodiment 1, not only effective from the viewpoint of reducing the 1/f noise of the amplification transistor ATr but also effective from the viewpoint of improving the "NBTI" of the p-channel field-effect transistor Q2.

In this context, in Embodiment 3, in the p-channel field-effect transistor Q2, the configuration of introducing fluorine into the part overlapping with the channel region CH in the gate electrode GE2 and not introducing fluorine into the interior of the semiconductor substrate 1S is adopted. On this occasion, the reason why fluorine is not introduced into the interior of the semiconductor substrate 1S is that, since it is assumed that the p-channel field-effect transistor Q2 according to Embodiment 3 is formed in the peripheral circuit of the image sensor, if fluorine is introduced into the interior of the semiconductor substrate 1S, tungsten that is a pollutant also intrudes simultaneously and then it is concerned that the number of white spots at dark and a dark current increase by the diffusion of the tungsten from the peripheral circuit region PER to the pixel array region PXLR in the semiconductor chip CHP. Additional reason is that, by the mechanism similar to Embodiment 1, the fluorine introduced into the gate electrode GE2 is more likely to be combined with a dangling bond formed in the gate insulation film GOX than the fluorine introduced into the interior of the semiconductor substrate 15 and is estimated to contribute largely to the reduction of the dangling bond. From this, according to Embodiment 3, like Embodiment 1, it is possible to: obtain both the reduction of the baseline noise of the image sensor and the inhibition of the increase of the number of white spots at dark and a dark current; and also improve the "NBTI" of the p-channel field-effect transistor Q2 included in the peripheral circuit. As a result, by the image sensor according to Embodiment 3, it is possible to improve reliability and performance.

Although the invention established by the present inventors has heretofore been explained concretely on the basis of the embodiments, it goes without saying that the present invention is not limited to the embodiments and can be modified variously within the range not departing from the tenor.

Although explanations have been made on the basis of an image sensor having a plurality of pixels formed in an imaging region of a semiconductor substrate and amplification transistors in the respective pixels in the embodiments, the technological thought in the embodiments is not limited to the case and can also be applied for example to an image sensor having a configuration of an amplification transistor being shared by an arbitrary number of pixels in the plural pixels included in an imaging region.

What is claimed is:

1. A method for manufacturing a solid-state image sensing device provided with a semiconductor substrate having an imaging region in which a plurality of pixels are formed,
    wherein the imaging region includes:
        photoelectron conversion sections to convert incident light into an electric charge; and
        amplification transistors to amplify an electric signal based on the electric charge,
    each amplification transistor including:
        a source region and a drain region formed in the semiconductor substrate so as to be isolated from each other;
        a channel region interposed between the source region and the drain region;
        a gate insulation film formed over the channel region; and
        a gate electrode formed over the gate insulation film,
    the method comprising the steps of:
        (a) forming the gate insulation film over the semiconductor substrate;
        (b) forming a first conductive film over the gate insulation film;
        (c) patterning the first conductive film and forming the gate electrode;
        (d) after step (c), forming the source region and the drain region in the semiconductor substrate;
        (e) after step (d), introducing fluorine into a portion of the gate electrode overlapping with the channel region in plan view; and
        (f) after step (e), heating the semiconductor substrate.

2. A method for manufacturing a solid-state image sensing device according to claim 1, wherein step (e) includes the steps of:
    (e1) forming a resist film over the semiconductor substrate to cover the source and drain regions and the gate electrode, and forming an opening in the resist film in the portion of the gate electrode overlapping the channel region in plan view; and
    (e2) introducing fluorine into the gate electrode through the opening by using the resist film as a mask.

3. A method for manufacturing a solid-state image sensing device according to claim 2, wherein step (e2) is carried out by an ion implantation method.

4. A method for manufacturing a solid-state image sensing device according to claim 3, wherein, at step (e2), fluorine is introduced at a dose quantity of not less than $1 \times 10^{14}$ atom/cm$^2$.

5. A method for manufacturing a solid-state image sensing device according to claim 1, wherein, at step (f), the semiconductor substrate is heated at a heating temperature of not lower than 650° C.

6. A method for manufacturing a solid-state image sensing device according to claim 1, the method comprising, after step (d) and before step (e), the steps of:
    (g) forming, over the semiconductor substrate, an interlayer insulation film to cover the gate electrode, the interlayer insulation film comprising a first insulation film and a second insulation film formed over the first insulation film; and
    (h) patterning the interlayer insulation film so as to expose a portion of the gate electrode overlapping with the channel region in plan view, and
    wherein in step (e), after step (h), fluorine is introduced into the gate electrode by using the patterned interlayer insulation film as a mask.

7. A method for manufacturing a solid-state image sensing device according to claim 6, the method further comprising a step of:
    (i) after step (e), forming a contact hole passing through the interlayer insulation film and reaching the source region or the drain region.

8. A method for manufacturing a solid-state image sensing device according to claim 7, wherein step (f) is carried out after step (i).

* * * * *